United States Patent [19]

Staheli et al.

[11] Patent Number: 5,537,533
[45] Date of Patent: Jul. 16, 1996

[54] SYSTEM AND METHOD FOR REMOTE MIRRORING OF DIGITAL DATA FROM A PRIMARY NETWORK SERVER TO A REMOTE NETWORK SERVER

[75] Inventors: Vaughn Staheli, Payson; Mike Miller, Pleasant Grove; Sam Francis; Dan Haab, both of Springville; Dan Patten, Orem; Kent Johnson, Spanish Fork, all of Utah

[73] Assignee: Miralink Corporation, Orem, Utah

[21] Appl. No.: 289,902

[22] Filed: Aug. 11, 1994

[51] Int. Cl.$^6$ ................................................. G06F 12/16
[52] U.S. Cl. ........................... 395/182.03; 395/182.18
[58] Field of Search ................................. 395/575, 200, 395/182.03, 182.04, 182.05, 182.13, 182.18

[56] References Cited

U.S. PATENT DOCUMENTS

| | | | |
|---|---|---|---|
| 4,274,139 | 6/1981 | Hodgkinson et al. | 364/200 |
| 4,654,819 | 3/1987 | Stiffler et al. | 364/900 |
| 4,819,159 | 4/1989 | Shipley et al. | 364/200 |
| 4,959,768 | 9/1990 | Gerhart | 364/187 |
| 5,051,887 | 9/1991 | Berger et al. | 364/200 |
| 5,133,065 | 7/1992 | Cheffetz et al. | 395/575 |
| 5,157,663 | 10/1992 | Major et al. | 371/9.1 |
| 5,163,131 | 11/1992 | Row et al. | 395/200 |
| 5,167,032 | 11/1992 | Martin et al. | 395/575 |
| 5,185,884 | 2/1993 | Martin et al. | 395/575 |
| 5,212,784 | 5/1993 | Sparks | 395/575 |
| 5,241,670 | 8/1993 | Eastridge et al. | 385/575 |
| 5,263,154 | 11/1993 | Eastridge et al. | 395/575 |
| 5,379,417 | 1/1995 | Lui et al. | 395/575 |

FOREIGN PATENT DOCUMENTS

PCT/US94/
04326 4/2094 WIPO.

OTHER PUBLICATIONS

"Remote StandbyServer", Vinca Corporation, Product Announcement, Sep. 12, 1994.
"Network Server", *Product Depot*, Sep. 1994, pp. 59–60.
"Network Management—Controlling and Optimizing Network Environments", Claudia Graziano, *LAN Times*, Jul. 11, 1994, p. 50.
Emerald Systems U.S.A. & Canada Retail Price List, effective Jul. 1, 1994.
"System Fault Tolerance With No Strings Attached", Bradley F. Shimmin, *LAN Times*, Feb. 28, 1994, vol. 11, Issue 4.
"Playing the Odds", Gary Gunnerson et al., *PC Magazine*, Oct. 26, 1993, v12, n18, pp. 285(28).
"Bulletproofing Your Server", David P. Chernicoff, *PC Week*, Oct. 4, 1993, v10, n39, pN1(3).
"Year-Old NetWare SFT II Still Incomplete: Support for UNIX", Patrick Dryden, *LAN Times*, Oct. 4, 1993, v10, n20, p1(2).

(List continued on next page.)

*Primary Examiner*—Robert W. Beausoliel, Jr.
*Assistant Examiner*—Alan M. Fisch
*Attorney, Agent, or Firm*—Madson & Metcalf

[57] ABSTRACT

A system for remote mirroring of digital data from a primary network server to a remote network server includes a primary data transfer unit and a remote data transfer unit which are connectable with one another by a conventional communication link. The primary data transfer unit sends mirrored data from the primary network server over the link to the remote data transfer unit which is located a safe distance away. Each data transfer unit includes a server interface and a link interface. The server interface is viewed by the network operating system as another disk drive controller. The link interface includes four interconnected parallel processors which perform read and write processes in parallel. The link interface also includes a channel service unit which may be tailored to commercial communications links such as T1, E1, or analog telephone lines connected by modems.

34 Claims, 40 Drawing Sheets

OTHER PUBLICATIONS

"On The Edge with SFT III", Patrick Dryden, *LAN Times*, Oct. 4, 1993, v10, n20, p1(3).

"SFT Level III Protection, But Without The Big Price Tag", *LAN Times*, Oct. 4, 1993, v10, n20, p101(7).

"Third–Party NLM Allows Multiple NIC's In Server", Eric Smalley, *PC Week*, Sep. 27, 1993, v10, n38, p73(1).

"An SFT Safety Net", Howard Lubert, *LAN Magazine*, Aug. 1993, v8, n8, p99(4).

"Startup NetGuard Systems Offers Alternative to SFT III", Patrick Dryden, *LAN Times*, Jul. 26, 1993, v10, n14, p7(1).

"Wired for the Future: 100M–bps Technology to Expand Networking Bandwidth", David P. Chernicoff, *PC Week*, Mar. 15, 1993, v10, n10, p49(3).

"Research Report—Disk Mirroring with Alternating Deferred Updates", Christos A. Polyzios et al., *Computer Science*, Mar. 4, 1993, pp. 1–25.

"Pipeline", *InfoWorld*, Mar. 8, 1993, v15, n10, p25(1).

"Mirrored NetWare Now Sold in Smaller Packs; Novell Ships SFT III", Florence Olson, *Government Computer News*, Feb. 15, 1993, v12, n4, p21(1).

"Fault–Tolerance App Gains Windows Support: Clone Star's Reflect 4.0 Takes on SFT III", Nico Krohn, *PC Week*, Feb. 15, 1993, v10, n6, p47(2).

"Finally, Fault–Tolerant LANs: a new Offshoot of NetWare Brings New Reliability, But Only to Limited Applications", Tracey Capen, *Corporate Computing*, Feb. 1993, v2, n2, p45(2).

"So You Need/Want Fault Tolerance? Don't Jump to Solutions", Paul Merenbloom, *InfoWorld*, Jan. 25, 1993, v15, n4, p38(1).

"System Fault Tolerance", Rodney Gallie, *InfoWorld*, Jan. 25, 1993, v15, n4, p65(1).

"Novell Ships Commercial Version of SFT III ", Nico Kohn, *PC Week*, Jan. 18, 1993, v10, n2, p18(1).

"Novell Adds Fault Tolerance to NetWare", *The Seybold Report on Desktop Publishing*, Jan. 6, 1993, v7, n5, p32(1).

"Tradeoffs in Implementing Primary–Backup Protocols", Navin Budhiraja and Keith Marzullo, Department of Computer Science—Cornell University, Oct. 1992, pp. 1–18.

"Research Report—Evaluation of Remote Backup Algorithms for Transaction Processing Systems", Christos A. Polyzois, *Computer Science*, Oct. 14, 1992, Department of Computer Science, Stanford University, pp. 1–35.

"Optimal Primary–Backup Protocols", Navin Budhiraja et al., Department of Computer Science, Cornell University, Aug. 1992, pp. 1–18.

"Performance of a Parallel Network Backup Manager", James da Silva et al., *Computer Science Technical Report Series*, Apr. 1992, pp. 1–13.

"A Cached WORM File System", Sean Quinlan, *Software—Practice and Experience*, Dec. 1991, vol. 21(12), pp. 1289–1299.

"Management of a Remote Backup Copy for Disaster Recovery", Richard P. King et al., *ACM Transactions on Database Systems*, Jun. 1991, vol. 16, No. 2, pp. 338–368.

"Performance of a Mirrored Disk in a Real–Time Transaction System", Shenze Chen and Don Towsley, *ACM Sigmetrics Performance Evaluation Review*, May 1991, pp. 198–207.

"A Comparison of Two Approaches to Build File Servers", Anupam Bhide et al., 11th International Conference on Distributed Computing Systems, pp. 616–623.

"Tandem's Remote Data Facility", Jim Lyon, Computer Conference, 1990, pp. 562–567.

"Issues in Disaster Recovery", Hector Garcia–Molina and Christos A. Polyzois, Department of Computer Science, Princeton University, Computer Conference 1990, pp. 573–577.

"Design Approaches for Real–Time Transaction Processing Remote Site Recovery", D. L. Burkes and R. K. Treiber, Data Base Technology Institute, IBM Almaden Research Center, Computer Conference 1990, pp. 568–572.

"Allocating Primary and Back–up Copies of Databases in Distributed Computer Systems: a Model and Solution Procedures", Hasan Pirkul and Yu–Ping Hou, College of Business, The Ohio State University, *Computers Opns Res.*, 1989, vol. 16, No. 3, pp. 235–245.

"Message–Optimal Incremental Snapshots", S. Venekatesan, Department of Computer Science, University of Pittsburgh, 9th International Conference on Distributed Computing Systems, 1989, pp. 53–60.

"PC Network Services for Distributed System Design", Gregory Ennis, Systek, Incorporated, Spring Computer Conference, 1986, pp. 155–160.

"Multi–Copy Workstation Databases", Fred Maryanski, University of Connecticut, Spring Computer Conference, 1985, pp. 50–53.

"Tape Backup and Network Storage Management", Emerald Systems Product Overview brochure.

"XpressSERVE Enterprise Software Highest–Performance, Server–Based Network Backup", Emerald Systems product brochure.

"Xpress Shadow Software Flexible Server Mirroring", Emerald Systems product brochure.

"Extra Value XpressSERVE & Xpress Librarian Bundled Solution", Emerald Systems product brochure.

"4 mm & 8 mm AutoLoaders for Total Automation", Emerald Systems product brochure.

"PC and LAN Servers", Network Solutions Systems information brochure.

"Network and Communications Solutions", Network Solutions Systems information brochure.

Quest Software information brochure.

"Octopus", P & W Technologies, Inc. product brochure.

"Octopus Real Time Data Protection", P & W Technologies, Inc. product description.

"–No*Stop–No*Stop–No*Stop–", Nonstop Networks Limited product brochure.

"Chapter 1: Introduction", *LANshadow 4.0*, pp. 1–37.

"Netware SFT III 3.11—Disaster Prevention Solution", Networld+Interop94 product brochure.

"Server Design tailored to SFT III . . . ," *InfoWorld*, Feb. 8, 1993, v15, n6, p29(1).

SYSTEM AND METHOD FOR REMOTE MIRRORING OF DIGITAL DATA FROM A PRIMARY NETWORK SERVER TO A REMOTE NETWORK SERVER

FIELD OF THE INVENTION

The present invention relates to the protection of mission-critical data in a client-server computer network as part of a business recovery plan, and more particularly to a system and method for remotely mirroring data such that a substantially concurrent copy of the critical data stored on a primary network server is also continuously available on a replacement network server which is located at a safe distance from the primary network server.

TECHNICAL BACKGROUND OF THE INVENTION

Banks, insurance companies, brokerage firms, financial service providers, and a variety of other businesses rely on client-server computer networks to store, manipulate, and display information that is constantly subject to change. A significant amount of the information stored as digital data in computer networks is mission-critical. For instance, the success or failure of an important transaction may turn on the availability of information which is both accurate and current. In certain cases the credibility of the service provider, or its very existence, depends on the reliability of the information displayed by the network.

Accordingly, many financial firms world-wide recognize the commercial value of their data and are seeking reliable, cost-effective ways to protect the information stored on their client-server computer networks. In the United States, federal banking regulations also require that banks take steps to protect critical data.

Mission-critical digital data may be threatened by natural disasters, by acts of terrorism, or by more mundane events such as computer hardware failures. Although these threats differ in many respects, they are all limited in their geographic extent. Thus, many approaches to protecting data involve creating a copy of the data and placing that copy at a safe geographic distance from the original source of the data. As explained below, geographic separation is an important part of data protection, but does not alone suffice for many network users.

The distance which is deemed safe depends on the expected threats to the data. Storing a copy of the data in the same room with the original data typically provides some protection against hardware failures; storing data in another room in the same building or in a building across the street may provide the copy of the data with sufficient protection against destruction by a fire that destroys the storage medium holding the original data. Acts of terrorism, earthquakes, and floods require greater separation. In some cases, separations of 30 miles or more are required.

In the mainframe computer environment a process known as "remote journaling" or "electronic vaulting" is used to protect data. A mainframe at the original data site is connected by a communications link to a remote mainframe which is located at a safe distance from the original site. Data written to the original mainframe's disks is also sent at essentially the same time to the communications link, and hence to the remote mainframe, where it is stored until needed. Mainframe electronic vaulting thus suggests that, in addition to geographically separating a copy of critical data, data protection for client-server networks should also include some way of updating the geographically separate copy of the data.

Although electronic vaulting provides an abstract model for the protection of client-server computer network data, the extreme differences between mainframe environments and client-server network environments prevent any substantial use of electronic vaulting hardware or software in such networks. At the hardware level, mainframe connectors, bus protocols, and signals are all typically incompatible with those of client-server computer networks. Hardware which connects a mainframe to a communications link will typically not even plug into a networked workstation or personal computer, much less function properly to permit communication.

At the software level, electronic vaulting code may be embedded within the mainframe's operating system, making it difficult or impossible to port the vaulting code to a client-server network environment. Even when the electronic vaulting software is not embedded within the mainframe's operating system, the interface between the proprietary mainframe operating system and the electronic vaulting software generally involves disk accesses, context switching, and other critical low-level operations. Such low-level software is generally very difficult to port to a network, which uses a very different operating system.

In addition, mainframes, unlike networks, do not typically face the prospect of coordinating the activities of numerous users, each of whom is controlling a separate machine having its own local operating system and central processing unit. Thus, mainframe software typically assumes "sole ownership" of files and other system resources. Such assumptions, which may permeate the electronic vaulting code, do not hold in a network.

A different approach to copying data, which is used both with mainframes and with networks, is off-site tape storage. Critical data is copied onto magnetic tapes at the end of each business day. These backup tapes are then taken by truck or plane to a storage site some distance from the original data. Thus, if a disaster of sufficiently limited geographic scope destroys data at the original site, the tapes kept at the storage site may be used to recover important information.

Although off-site tape storage is relatively simple and inexpensive, it has severe limitations. Most importantly, the data on the tapes is only as current as the most recent backup. Thus, assume a business's backup finished at 1:00 AM, the business opened at 8:00 AM, and a disaster occurred at 3:00 PM. Then the business activity in the seven hours from 8:00 AM to 3:00 PM is lost, because it was not stored on the tape. It may be difficult or impossible to accurately reconstruct every transaction that occurred during the lost period. Persuading everyone involved that the reconstruction is accurate may also present problems. In short, merely creating a geographically separate copy of data does not provide adequate protection. The remote copy must also be substantially current.

A continuing disadvantage of off-site tape storage is the time required to create the tape backup. To ensure the integrity of data being stored on the tape, only the backup software typically has access to the network during the backup procedure. If a business closes at the end of each day and leaves its computer network essentially unused at night, the opportunity costs of restricting access during the backup procedure are negligible. However, an increasing number of computer networks are used by businesses that operate world-wide, and hence these networks are needed 24 hours a day, 7 days a week. Shutting down such networks for several hours each day to make a tape backup may have a significant adverse effect on the business.

In addition, hours or days may be needed to restore data from the backup tapes onto hard drives or other immediately useable media. The computer network's performance may be reduced while data is being restored. Indeed, in some instances it is necessary to deny all other users access to the network while data is being restored, in order to ensure the integrity of the data after the restoration.

Another approach to copying data stored on computer networks is known as "data shadowing." A data shadowing program cycles through all the files in a computer network, or through a selected set of critical files, and checks the timestamp of each file. If data has been written to the file since the last time the shadowing program checked the file's status, then a copy of the file is sent over a communications link to another program which is running on a remote computer. The remote program receives the data and stores it at the remote site on tapes or other media. As with off-site tape storage, hours or days may be required to restore shadowed data to a useable form at the original site.

Shadowed data is typically more current than data restored from an off-site tape backup, because at least some information is stored during business hours. However, the shadowed data may nonetheless be outdated and incorrect. For instance, it is not unusual to make a data shadowing program responsible for shadowing changes in any of several thousand files. Nor is it unusual for file activity to occur in bursts, with heavy activity in one or two files for a short time, followed by a burst of activity in another few files, and so on. Thus, a data shadowing program may spend much of its time checking the status of numerous inactive files while a few other files undergo rapid changes. Mission-critical data may be lost because the shadowing program is driven by the list of files and their timestamps rather than directly by file activity.

Many conventional attempts to protect data also share another problem, namely, that open files are not copied. The contents of files which have been "opened" for access by users may change during tape backup, data shadowing, or other procedures that create a copy of the file contents. These changes may lead to internal inconsistencies and lost data because a copy program (e.g., a tape backup or data shadowing program) sees one part of the file before the change and another part of the file after the change.

For instance, suppose that an open file has a length of 10,000 bytes and this length is recorded in the first block of the file. Critical data will be lost if events occur as follows: (1) the copy program notes that the file is 10,000 bytes long; (2) an additional 5,000 bytes of critical new data is added to the end of the open file by the user; and (3) at some later time, the original copy of the file-including the 5,000 new bytes—is destroyed.

The copy program will only have copied the first 10,000 bytes of the file. The additional 5,000 bytes will be lost even if the program had plenty of time to copy that data as well, because the copy program doesn't "know" that the additional data is there until it works its way back to the file in question. Depending on the copy program, the number of files involved, and other factors, minutes or even hours may pass before the program returns to the file in question and notes that additional data needs to be copied.

Accordingly, client-server computer network operating systems typically restrict access to open files, and conventional data copying methods generally do not create copies of open files even when permitted to do so by the network operating system. However, the failure to copy open files also has severe drawbacks. Files may be left open longer than necessary, so that their mission-critical contents are actually stable enough to copy but are nevertheless not copied simply because the file is open. Thus, data may be lost even though it could have been copied to a safe location, merely because a file was left open longer than necessary.

In addition, failure to copy even a single open file in a relational database may lead to the loss of data in many files because such databases depend on files that are interrelated and sequential. For instance, suppose a database must search in sequential order through files A, B, C, and D to obtain the required information. Suppose file C was open during the backup and therefore was not copied. The data restored after a disaster may therefore include copies of files A, B, and D which are more current than the most recent available copy of file C. Such inconsistencies may corrupt the database and render useless the information in all four files.

Perhaps the most common solution to the open file problem is to perform backup procedures at the end of the work day. All users except the backup software are logged off the system, and all files are closed. Thus, a current, complete, and consistent copy of the critical data is obtained. However, this approach to dealing with open files has many of the drawbacks of off-site tape storage. Many networks, such as those used by hotel and airline reservation systems, credit authorization services, and global trading position databases, are in use non-stop. Moreover, critical data added after the backup software finishes is not protected until the next backup or shadowing file copy, which may be minutes or hours later.

Thus, it would be an advancement in the art to provide a system and method for effectively protecting mission-critical data in a client-server computer network.

It would also be an advancement to provide such a system and method which maintain a substantially current copy of critical network data.

It would be a further advancement to provide such a system and method which maintain a substantially current copy of data as that data is committed for storage in open files on disk.

It would also be an advancement to provide such a system and method which do not require limiting or denying access by other users while a copy of the critical data is created.

In addition, it would be an advancement in the art to provide such a system and method which permit storage of the data copy at distances up to 30 miles or more from the original data.

It would also be an advancement to provide such a system and method which make the copied data useable immediately after a disaster.

Such a system and method are disclosed and claimed herein.

BRIEF SUMMARY OF THE INVENTION

The present invention provides a system for remote mirroring of digital data from a primary network server to a remote replacement network server. As used herein, "mirroring" means creating a copy of data as the data travels toward a storage location on nonvolatile media. Mirroring may include copying data whose immediate destination is a dedicated RAM cache if the data's ultimate destination is a nonvolatile medium. Data shadowing or tape backup creation do not involve mirroring, because they typically involve reading data from nonvolatile storage, and also involve copying the data many seconds, minutes, or even hours after the data originally reached the nonvolatile storage.

"Remote mirroring" means transmitting mirrored data to a remote location for storage. Conventional network servers have the ability to locally mirror data by copying data to a disk which is physically located within a few feet of the network server. But known systems lack the remote mirroring capability of the present invention. Moreover, unlike data shadowing or tape backup approaches, remote mirroring captures data early in the data's existence. Remote mirroring thus significantly reduces the risk that the data will be destroyed before a copy of the data is sent to a safe remote storage location.

The primary network server and the remote replacement network server which are used in conjunction with the present invention each have their own nonvolatile server store. "Nonvolatile" stores include data storage media such as magnetic or optical disk drives which preserve data in the absence of any external source of power. By contrast, random access memory ("RAM") is typically a volatile medium because it does not preserve data when power to the server is lost.

A presently preferred embodiment of the invention includes a primary data transfer unit ("primary DTU") and a remote data transfer unit ("remote DTU") which are connectable with one another by a conventional communication link. In operation, the primary DTU sends mirrored data from the primary network server over the link to the remote DTU, which is located at a safe distance from the primary DTU. The remote DTU receives the mirrored data and sends it in turn to the replacement server. The replacement server then stores the remotely mirrored data in a conventional manner.

The replacement server is not active as a network server while the primary server is functioning normally, but stands ready to be brought on-line rapidly as a replacement if the primary server fails. At most one instance of the network operating system runs at any time, even though the primary server and the remote server each have a copy of the operating system. The phrases "remote server," "remote network server," "remote replacement server," "replacement server," and "remote network replacement server" are synonymous herein.

Thus, the invention is useful in creating a copy of data at a safe distance from the original data substantially concurrently with the storage of the original data. Moreover, the copied data is useable almost immediately after a disaster, because it has been copied to a "warm" remote network server which can be up and running as the new primary server within minutes of the disaster.

The primary DTU includes a primary server interface and a primary link interface. The primary server interface is digitally connectable to the primary network server, and has sufficient bandwidth and signal compatibility to receive mirrored data from the primary network server as that data is created. The mirrored data tends to arrive in high bandwidth bursts, as it is a substantially concurrent copy of original data which is destined for storage in the nonvolatile server store of the primary network server.

The primary link interface is digitally connected to the primary server interface, and is capable of receiving the mirrored data from the primary server interface and sending it across a conventional communication link to the remote DTU. A checksum is preferably computed on the data and transmitted with the data so the remote DTU can detect transmission errors. The data may also be compressed and/or encrypted by the primary DTU before it is placed on the link. Communication links to which the link interface is tailored include T1, E1, analog telephone line, and other conventional links.

The remote DTU similarly includes a remote link interface and a remote server interface. In fact, the primary DTU and the remote DTU preferably include identical hardware and software. The remote link interface is connectable to the communication link for receiving the mirrored data sent across the link by the primary DTU. The remote DTU has decompression and decryption capabilities corresponding to the compression and encryption capabilities of the primary DTU.

The remote server interface is digitally connected to the remote link and is capable of receiving the mirrored data from the remote link. The remote server interface is digitally connectable to the remote network server and has sufficient bandwidth and signal compatibility to send the mirrored data to the remote network server. Each DTU is equipped with a link interface diagnostic unit which provides selected status and diagnostic information in a human-readable format.

The DTUs and other system components are configured such that the mirrored data is normally sent to the remote network server by the remote server interface within a measurable delay time, such as 1 or 10 seconds, from the time the mirrored data is received by the primary server interface. The system is preferably configured such that the mirrored data is also stored in the nonvolatile server store of the remote network server within a short time, e.g., 10 seconds, from the time the corresponding original data is stored in the nonvolatile server store of the primary network server.

The primary network server typically provides mirrored data to the primary DTU in bursts whose bandwidth is greater than the bandwidth of the link between the DTUs. In addition, it may be necessary to use the remote server for tasks other than receiving and storing mirrored data. Thus, one or both of the DTUs preferably includes a data buffer, and most preferably includes a data buffer which is nonvolatile to reduce the risk of data loss. The presently preferred data buffer includes magnetic hard disks disposed within each DTU.

Each of the DTUs includes at least one microprocessor and a block of RAM which is accessible by the microprocessor. It is presently preferred that each DTU include four digitally interconnected parallel processors. Each parallel processor includes a microprocessor, a block of RAM accessible by the processor, and up to four interprocessor serial communication lines which support communication between parallel processors. In operation, the parallel processors work substantially concurrently to process different selected portions of the mirrored data. For instance, two parallel processors read data from the primary server interface substantially in parallel.

The present invention also provides a method for remote mirroring of digital data. The method begins by using the local disk mirroring utility of a conventional client-server network operating system to copy the data from a primary network server to a primary DTU which is digitally connected to the primary network server. Then the data is copied from the primary DTU to an input end of a communication link, possibly after being compressed and/or encrypted. The output end of the communication link is physically separated from its input end by a distance of at least 100 feet. The data is copied from the output end of the communication link to a remote DTU, any required decompression or decryption is performed by the remote DTU, and the data is sent by the remote DTU to a nonvolatile server store on a remote network server.

The data typically moves between a server and a DTU in chronologically spaced-apart, rapid, high bandwidth bursts. The communication link between the DTUs generally has lower bandwidth, but also permits transmissions that last longer than such bursts. Thus, the data is preferably copied to a nonvolatile data buffer in the primary DTU in order to allow the use of a conventional communication link having lower bandwidth than the bandwidth of the channel between the server and the server interface.

The copying steps which move the data between the servers and the DTUs are preferably implemented by substantially concurrent copying of different selected portions of the data. That is, several computer-implemented parallel copying processes are used to accomplish substantially concurrent copying. The parallel processes communicate with one another to coordinate the copying.

Thus, the present invention provides a system and method for effectively protecting mission-critical data in a computer network. Unlike data shadowing or tape backup approaches, the present invention stores mirrored data and hence maintains a substantially current copy of the data, including data in open files, without limiting access by other users. The mirrored data is moved by the DTUs to safe distances up to 30 miles or more from the original data. The copied data is also useable immediately after a disaster, because it has been copied to the nonvolatile store of a "warm" remote network server which can be rapidly placed in operation as the new primary network server.

These and other features and advantages of the present invention will become more fully apparent through the following description and appended claims taken in conjunction with the accompanying drawings.

BRIEF DESCRIPTION OF THE DRAWINGS

In order that the manner in which the above-recited and other advantages and features of the invention are obtained, a more particular description of the invention summarized above will be rendered by reference to the appended drawings. Understanding that these drawings only provide a selected embodiment of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1:
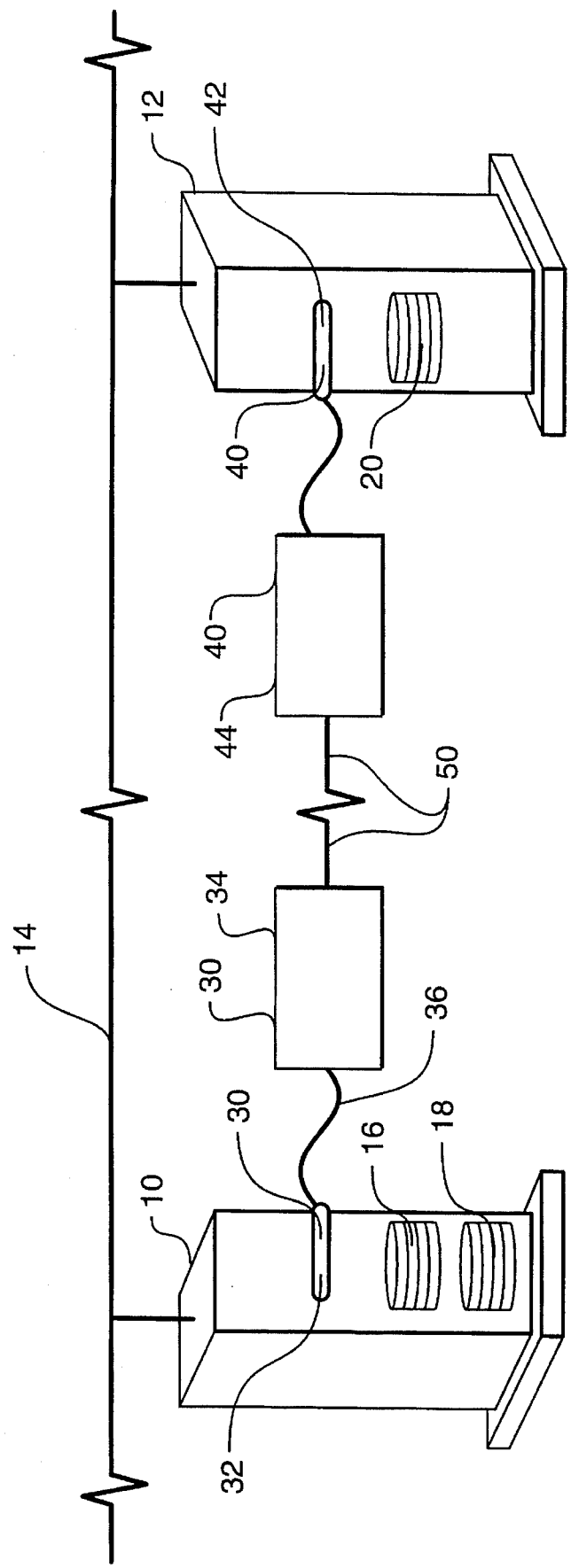
FIG. 1 is a schematic diagram illustrating two data transfer units of the present invention connecting a primary network server with a remote network server.

Reference is now made to the figures wherein like parts are referred to by like numerals. With reference to FIG. 1, the present invention relates to a system and method for remote mirroring of digital data from a primary network server 10 to a remote network server 12. The servers 10, 12 are conventional servers for a local area network ("LAN") and/or a wide area network ("WAN").

It is presently preferred that the servers 10, 12 be IBM PC-compatible servers capable of running the Novell NetWare® operating system. The primary server 10 actually runs the operating system, while the remote server 12 preferably runs a simple DOS data-capturing program that transfers data from the remote DTU 40 to the remote disk 20. Although only one copy of the client-server network operating system is in use at any time, the remote server is preferably a "warm" server in that it is equipped with a copy of the network operating system and may be brought on-line as the new primary network server if the original primary network server 10 is disabled.

Those of skill in the art will appreciate that other hardware platforms such as 680×0-, PowerPC®, or RISC-based architectures, possibly in combination with other operating systems such as UNIX® or NT® operating systems, may also be advantageously employed in conjunction with the present invention. POWERPC is a trademark of International Business Machines Corp.; UNIX is a registered trademark of Unix System Laboratories, Inc.; NT is a registered trademark of Microsoft Corp. Also, the servers 10, 12 may be connected by a conventional LAN or WAN 14 in addition to the remote mirroring connection provided by the present invention.

As noted above, "mirroring" means creating a copy of data as the data travels toward a storage location on nonvolatile media. In the configuration shown in FIG. 1, the primary server 10 includes two magnetic hard disks 16, 18, and the remote server 12 includes one magnetic hard disk 20, as nonvolatile server stores. The hard disk 20 preferably has a storage capacity of at least about 500 Mbytes, and preferably follows a write-read-verify-acknowledge protocol to detect and subsequently avoid bad hard disk sectors. However, those of skill in the art will appreciate that other types of nonvolatile media, such as optical disks or RAM powered by an uninterruptible power supply, may also be used in either or both of the servers 10, 12.

A presently preferred system embodying the invention includes a primary data transfer unit ("primary DTU") 30 and a remote data transfer unit ("remote DTU") 40. The primary DTU 30 includes a primary server interface 32 and a primary link interface 34. The remote DTU 40 similarly includes a remote server interface 42 and a remote link interface 44.

Except as otherwise noted herein, the two link interfaces 34, 44 preferably comprise the same hardware and software. The presently preferred link interface software can identify attributes of data packets and, based on these attributes and the direction of packet movement, the software can determine whether it resides on the primary DTU 30 or on the remote DTU 40. Appropriate portions of the software may thus be invoked on each DTU 30, 40 without requiring the user to manually set a hardware switch or take similar action. The two server interfaces 32, 42 likewise preferably comprise identical hardware controlled by appropriate portions of identical software. As used herein, "software" includes firmware, object code, and other program instructions capable of controlling microprocessors or other computer hardware.

It is presently preferred that the network operating system on the primary network server 10 mirror the data and then transmit the mirrored data to the primary DTU 30. Conventional operating systems such as Novell NetWare® provide suitable local mirroring or duplexing capability. Conventional hardware and software provide mirroring and local transmission of the mirrored data for distances of about fifty feet.

According to the teachings herein, the network operating system is made to see the remote disk 20 as simply another drive available to the primary server 10, and so is able to use its mirroring utility and the present invention to remotely mirror data to that disk 20 even when the disk 20 is miles away from the primary server 10. Moreover, the mirrored data includes a substantially concurrent copy of original critical data, including data which is being sent by the operating system to the local disk 16 for storage in a presently open file of the primary network server 10.

Advantageously, the present invention does not require that the primary server 10 and the remote server 12 utilize identical hardware or that their hard disks 16, 20 operate in lockstep with each other. The present invention also does not require transmission of substantial amounts of information other than the user's critical data. Unlike conventional remote duplication of an entire file server, such as with Novell SFT III, the remote mirroring of file data according to the present invention does not require transmission of CPU registers, cache, operating system process contexts, and the like between the primary and remote servers 10, 12.

Thus, the bandwidth of the link 50 between the DTUs 30, 40 which is required for effective performance of the present invention is substantially lower than the bandwidth that would be required to remotely mirror an entire file server. A link 50 having a bandwidth of about 1.5 Mbits/sec is adequate for many applications of the present invention, whereas full server mirroring could require a communication link 50 bandwidth of at least about 100 Mbits/sec. The present invention will operate over existing communication links 50, such as existing telephone and data lines, without requiring the user to lay a new dedicated fiber optic cable or other high-bandwidth signal carrier.

The server interface 32 is preferably configured such that it emulates a conventional I/O device controller in communicating with the server 10. In particular, it is presently preferred that the server interface 32 emulate a hard disk drive controller. Thus, the hardware and operating system of the server 10 communicate with the server interface 32 as they would communicate with the controllers of conventional hard disk drives 16, 18.

Hard disk controller emulation by the server interface 32 allows utilization of the built-in data duplication capability of the operating system of the primary server 10. The operating system is instructed in a conventional manner to duplicate critical data as that data is sent toward the main disk 16. The duplication may utilize one or more I/O channels. In the configuration illustrated in FIG. 1, the duplicated data is copied to the local disk 18 to guard against data loss from failure of the main disk 16. More importantly, a duplicate of the data is also routed to the server interface 32 for remote mirroring by way of the present invention.

The server interface 32 passes the mirrored data it receives from the server 10 to the link interface 34. The server interface 32 shown in FIG. 1 communicates with the link interface 34 by way of a high-speed serial link 36, but those of skill in the art will appreciate that parallel links may be employed in other embodiments. One combination of hardware and software which is suitable for use as either the primary server interface 32 or the remote server interface 42 is the StandbyServer product available from Vinca Corporation of Orem, Utah.

Figure 2:
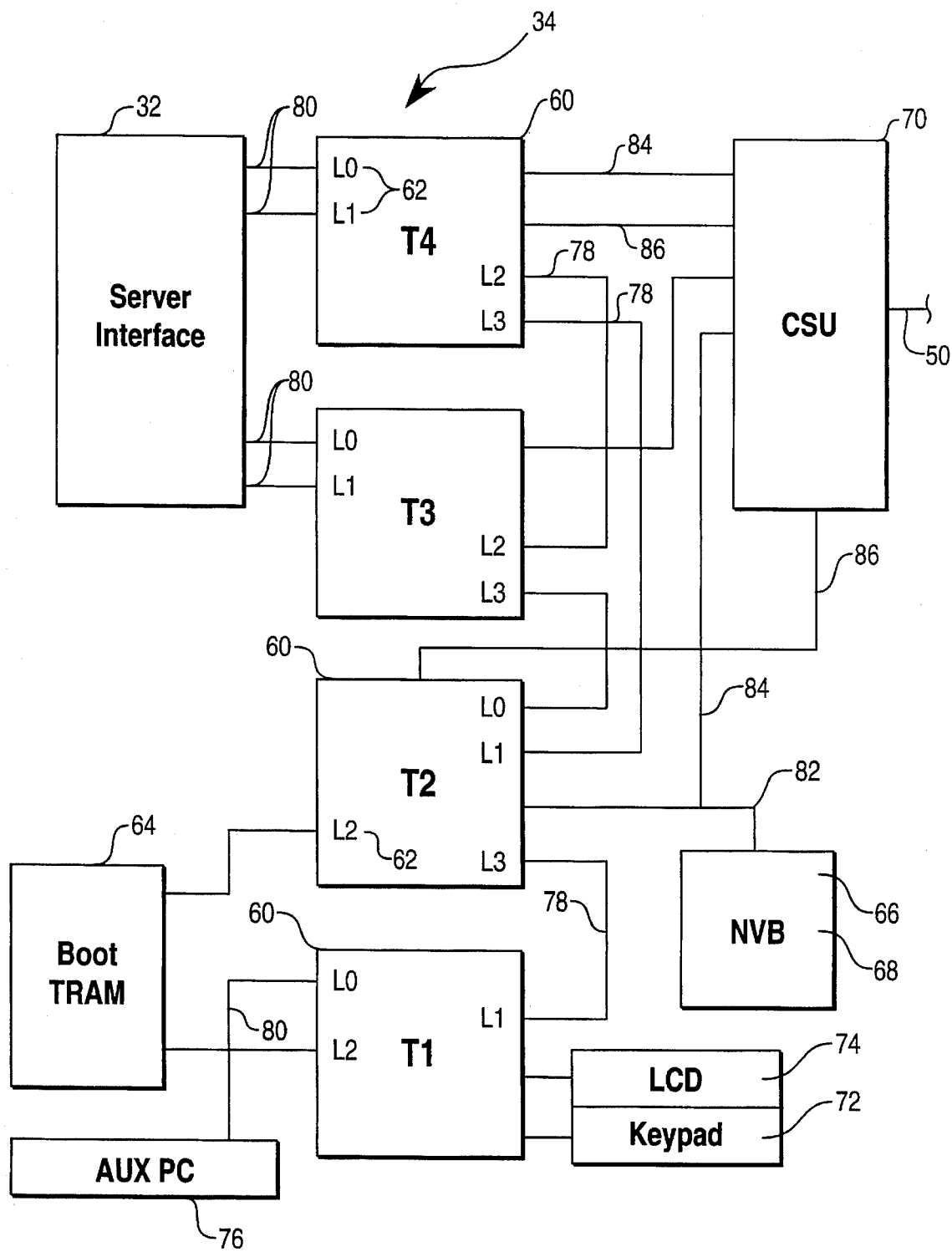
FIG. 2 is a hardware block diagram illustrating the presently preferred embodiment of the link interface portion of the data transfer unit of the present invention, including four parallel processors labeled T1 through T4, a channel service unit, a boot module, keypad and display I/O devices, and a nonvolatile buffer.

FIG. 2 illustrates a presently preferred embodiment of the link interface 34. The link interface 34 includes four parallel processors 60, which are individually labelled T1 through T4 in FIG. 2. Parallel processors are microprocessors designed specifically for interprocess communication and hence are well-suited for use in parallel processing applications. Each parallel processor 60 includes an arithmetic and logical processing unit and local RAM accessible by that processing unit. Each parallel processor 60 also includes four serial communication ports 62, which are individually labelled L0 through L3.

It is presently preferred that each of the parallel processors 60 include a Transpurer® microprocessor; Transputer is a registered trademark of Inmos Ltd. Presently preferred embodiments of the parallel processors 60 and serial ports 62 are further illustrated in the hardware schematic diagrams of FIGS. 8 through 29, but those of skill in the art will appreciate that other embodiments may also be utilized according to the present invention.

With reference once more to FIG. 2, the link interface 34 also includes a boot module 64 ("boot TRAM"). As further illustrated in FIGS. 36 through 39, the boot TRAM 64 preferably contains an EPROM which holds the boot program that loads the operating software which controls the link interface 34 to perform the operations described herein.

As shown in FIG. 2, the preferred embodiment of the link interface 34 also contains a nonvolatile buffer 66. The presently preferred nonvolatile buffer 66 is a conventional magnetic hard disk drive 68. However, optical drives, RAM powered by an uninterruptible power supply, or other nonvolatile storage media may also be utilized according to the present invention.

A channel service unit ("CSU") 70 acts as the direct interface between the rest of the link interface 34 and the conventional communication link 50. A presently preferred embodiment of the CSU 70 contains circuits for receiving data from the parallel processors 60 (FIGS. 12 through 14), control circuits (FIGS. 15 through 19), and circuits for transmitting data to the communication link 50 (FIGS. 20–24, 30–31, and 33–35).

With reference to FIGS. 2 and 25–31, the link interface 34 preferably also includes a keypad 72, a display such as a liquid crystal display ("LCD") 74, and supporting circuitry. Thus, the link interface 34 is capable of providing performance and diagnostic information in human-readable format. Additional information and control are preferably available via an auxiliary computer 76 which may be placed in serial communication with the link interface 34.

With reference to FIG. 2, the parallel processors T1 through T4 are interconnected by serial communication lines 78. Additional serial communication lines 80 connect one or more of the parallel processors 60 with the server interface 32, the boot TRAM 64, and the optional auxiliary computer 76. A data bus 82, which is preferably 16 bits wide, connects the parallel processor T2 to the nonvolatile buffer 66. Other data buses 84, which are preferably 8 bits wide, connect the CSU 70 to the parallel processors T2 and T4. Control lines 86 connect the CSU 70 with parallel processors T2, T3, and T4.

Presently preferred embodiments of the communication lines, data buses, and control buses, and their associated buffers and processors, are illustrated in FIGS. 8 through 39, but those of skill in the art will appreciate that other embodiments may also be utilized according to the present invention. Moreover, although particular assignments of the serial ports 62 are illustrated, other port assignments may also be utilized according to the present invention.

As a very simple example, the assignments of port L0 and port L1 of parallel processor T1 could be swapped in the hardware and software of the link interface 34, such that port L0 would connect to the boot TRAM 64 and port L1 would connect to the auxiliary computer 76. Moreover, the labeling of the parallel processors may also vary. Indeed, the processors labelled T1 through T4 in FIGS. 2 through 7 are respectively denoted T4 through T1 in the hardware schematics of FIGS. 8 through 39.

Figure 3:
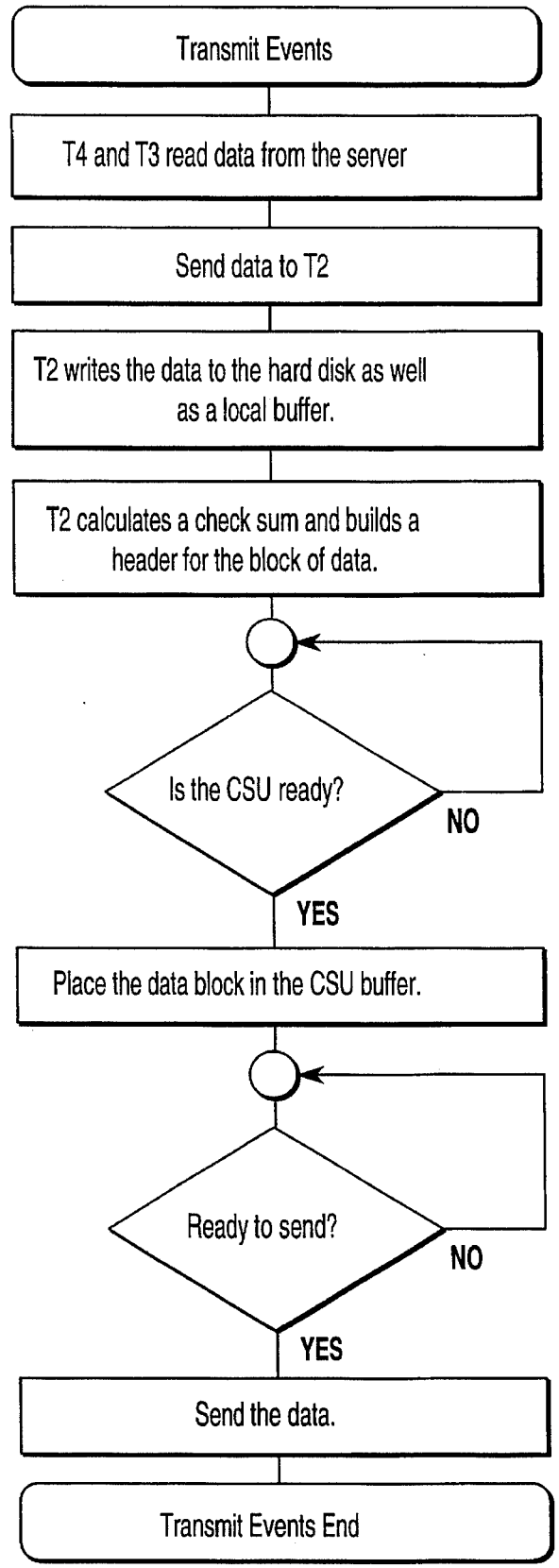
FIG. 3 is a flowchart illustrating the events involved in transmitting a packet of mirrored data from the server interface portion of a primary data transfer unit to a communication link which connects the primary data transfer unit with a remote data transfer unit.
Figure 4:
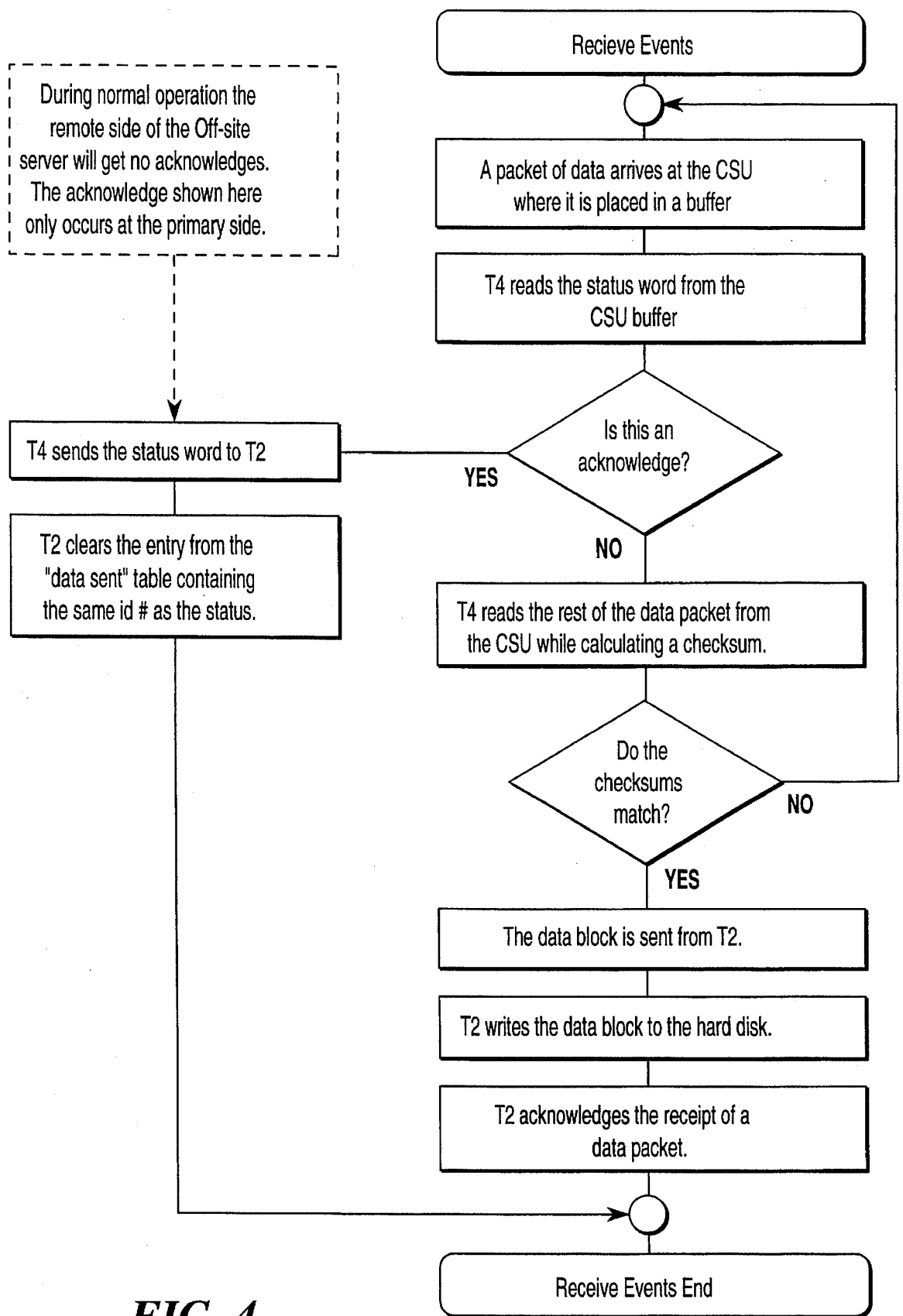
FIG. 4 is a flowchart illustrating the events involved in receiving a packet of mirrored data sent from the primary data transfer unit over the communication link to the remote data transfer unit.
Figure 5:
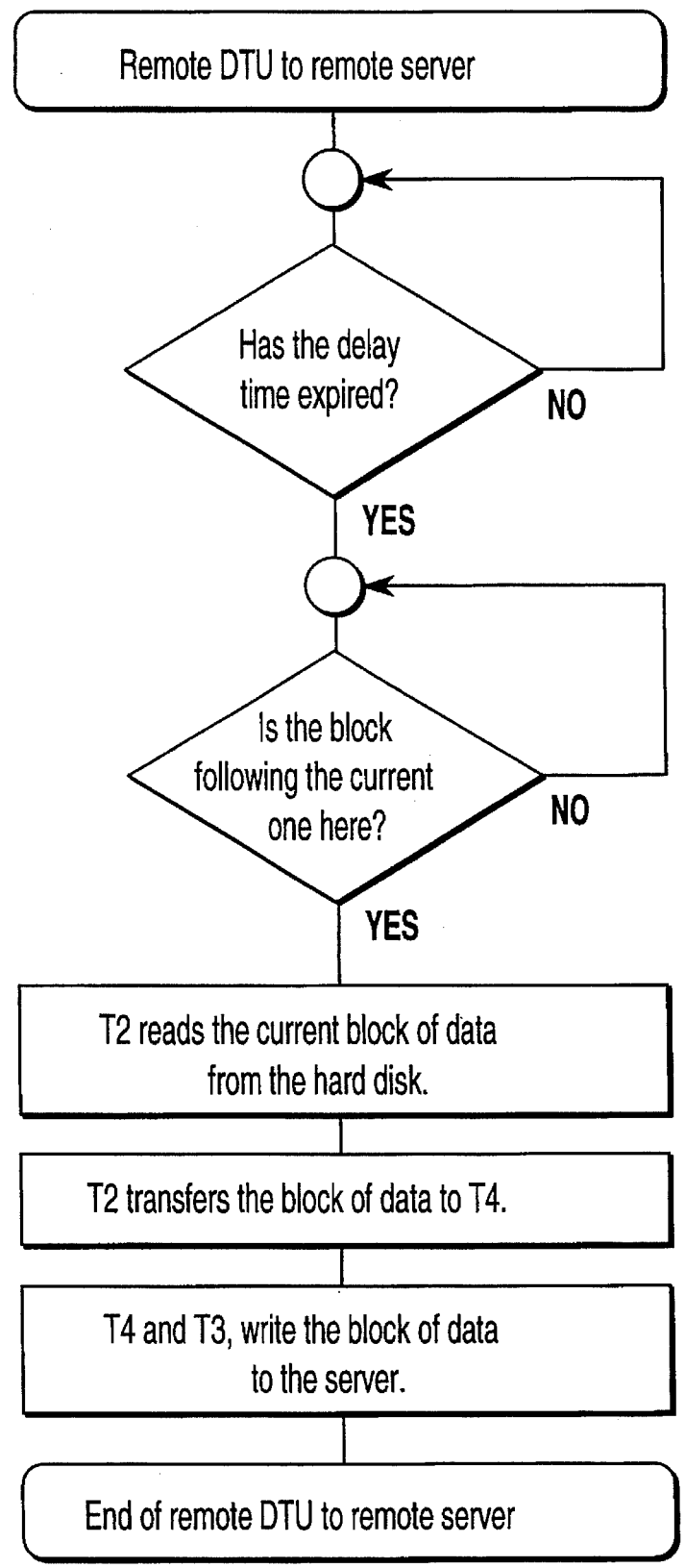
FIG. 5 is a flowchart illustrating the events involved in transmitting a packet of mirrored data from the link interface of the remote data transfer unit to a remote server interface.
Figure 6:
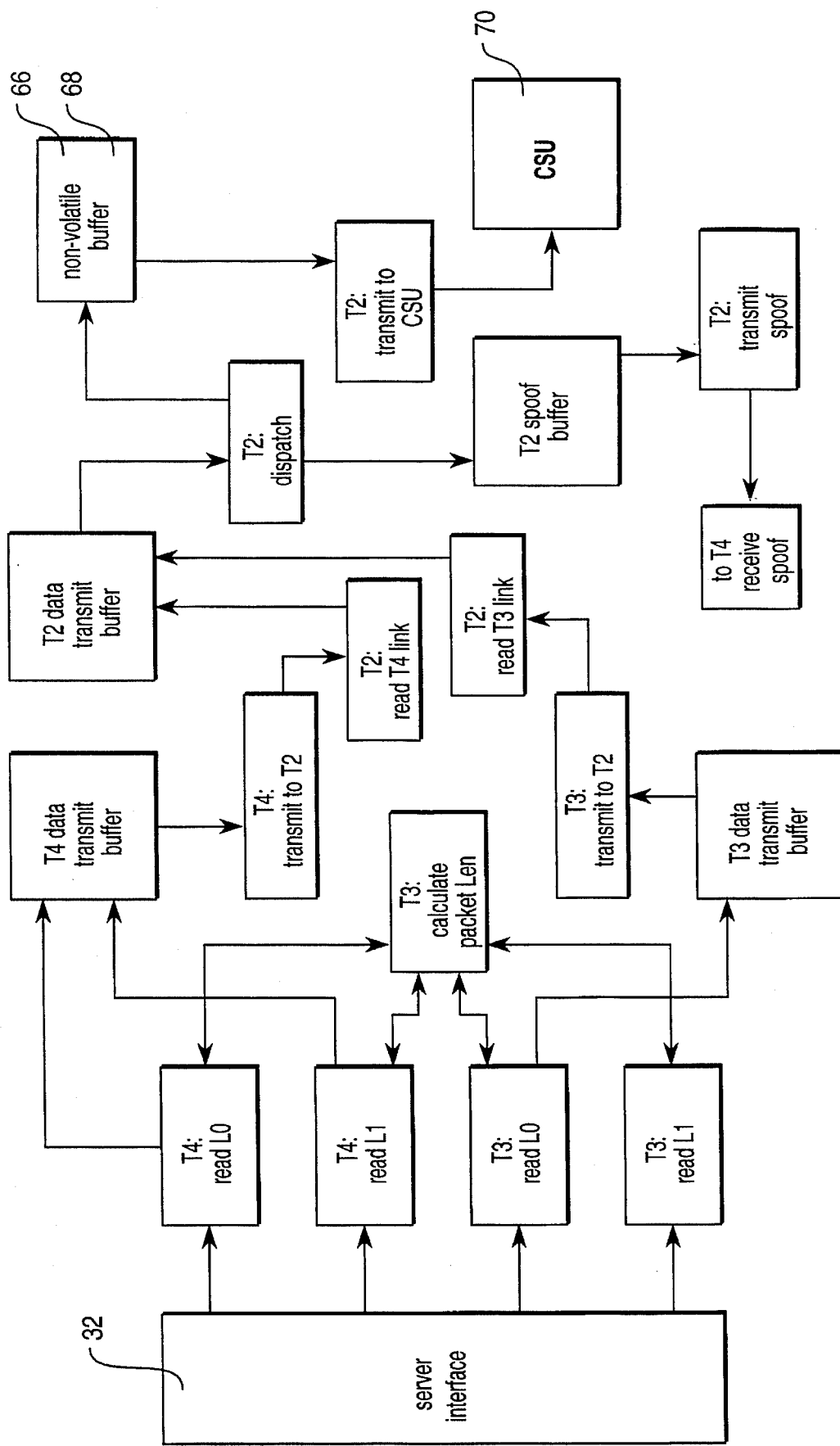
FIG. 6 is a schematic block diagram illustrating software processes and hardware resources involved in sending data from the link interface.
Figure 7:
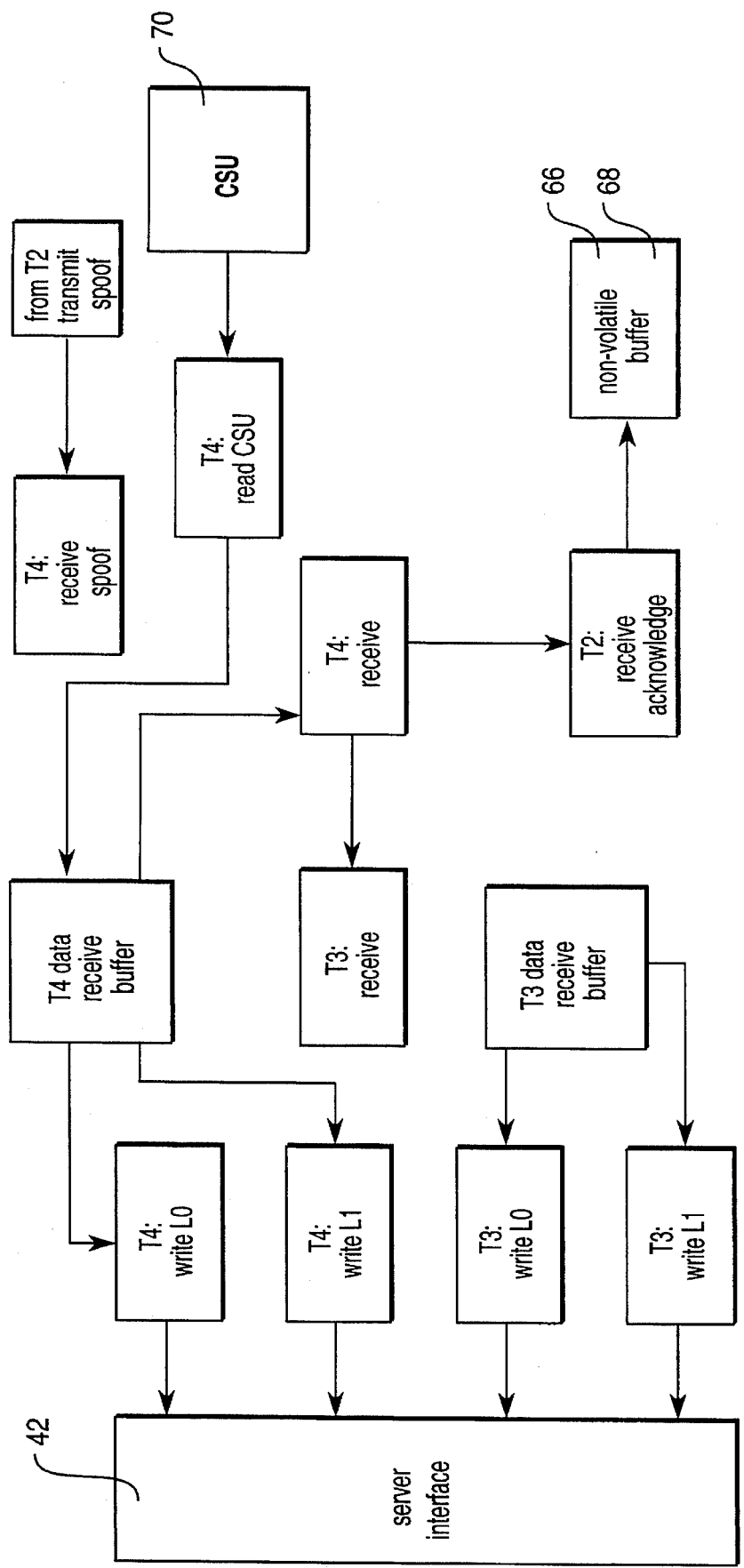
FIG. 7 is a schematic block diagram illustrating software processes and hardware resources involved in receiving data at the link interface.
Figure 8:
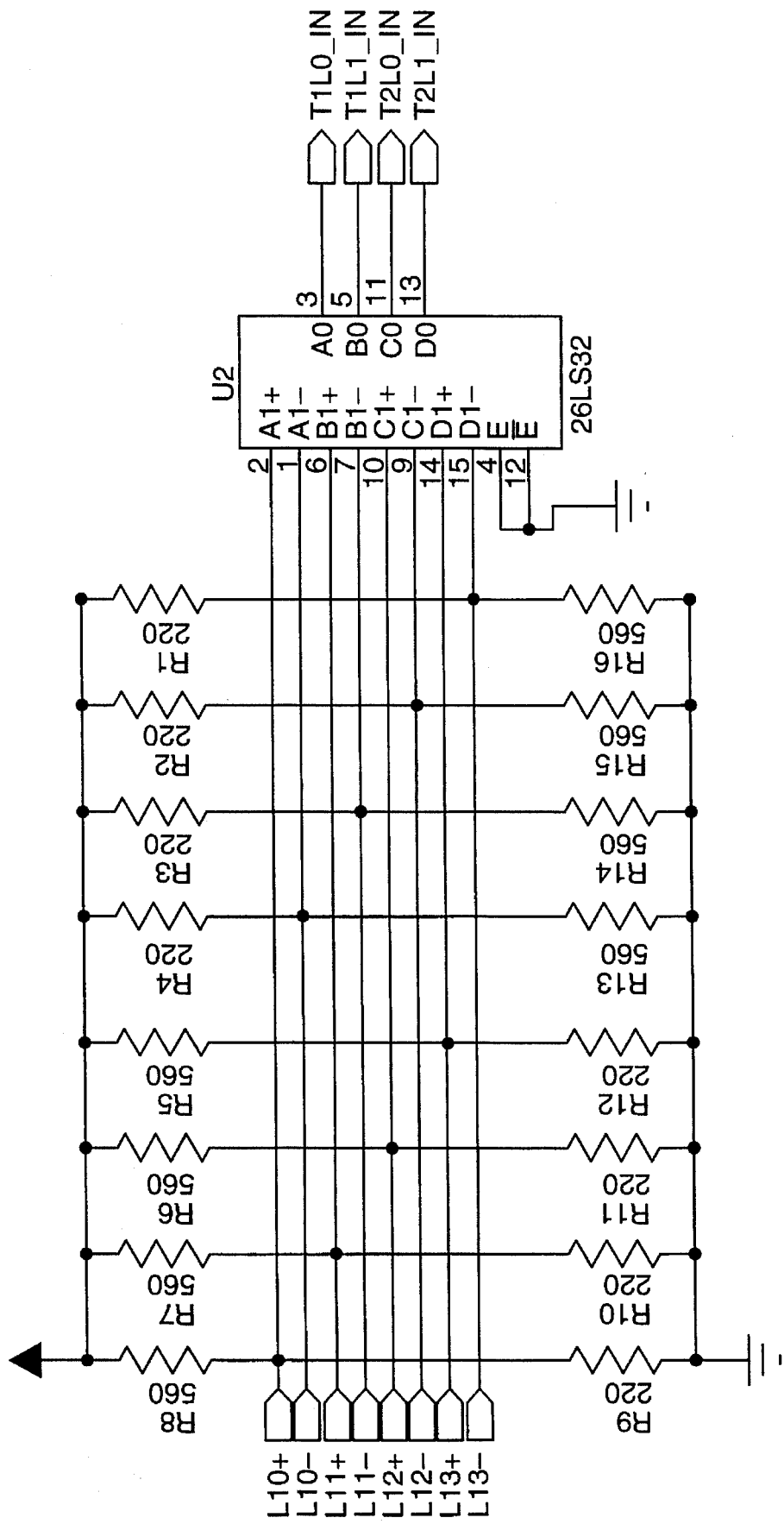
FIGS. 8 through 11 are hardware schematic diagrams illustrating a presently preferred embodiment of a serial interface to parallel processors of the link interface.
Figure 9:
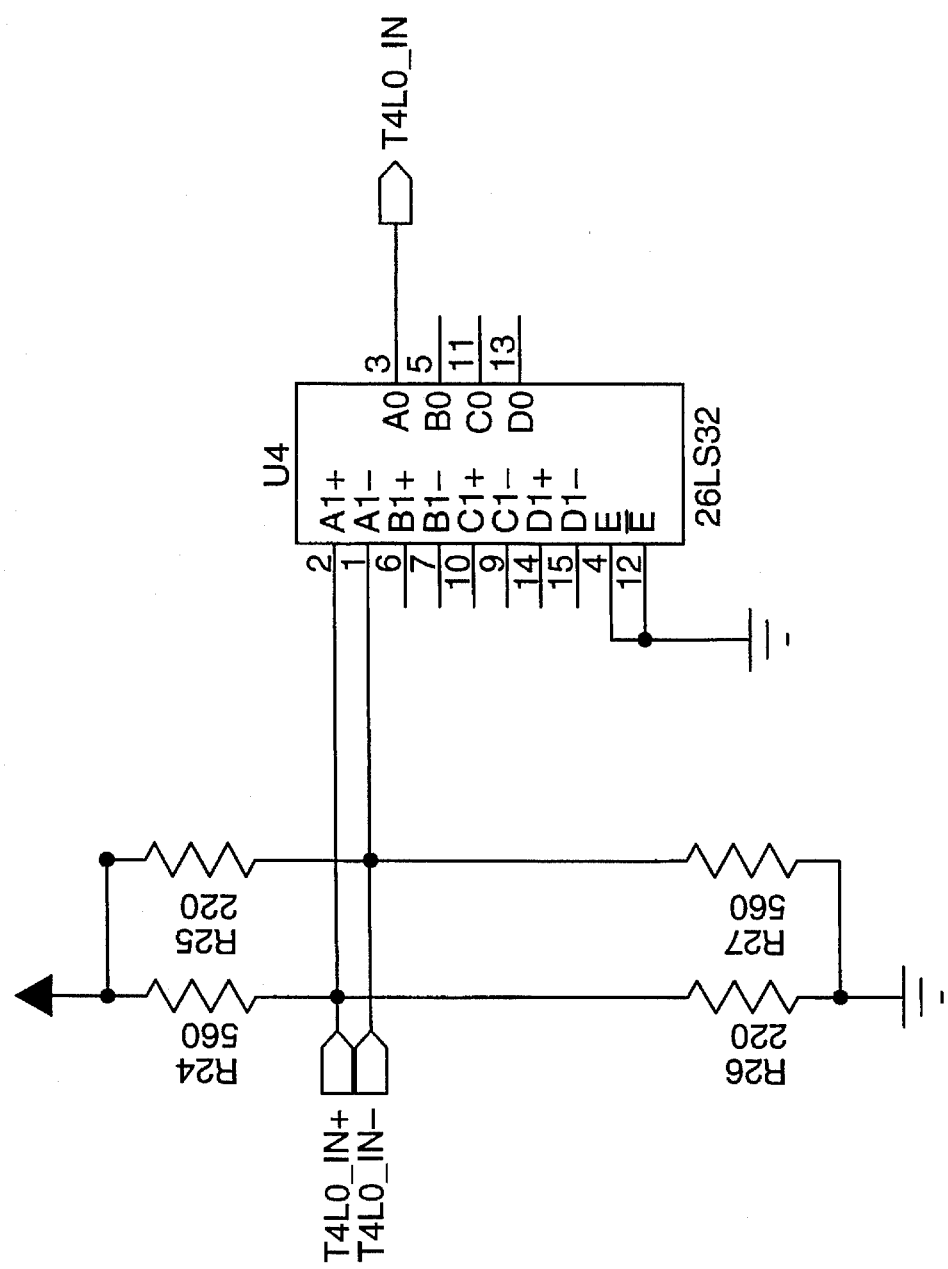
Figure 10:
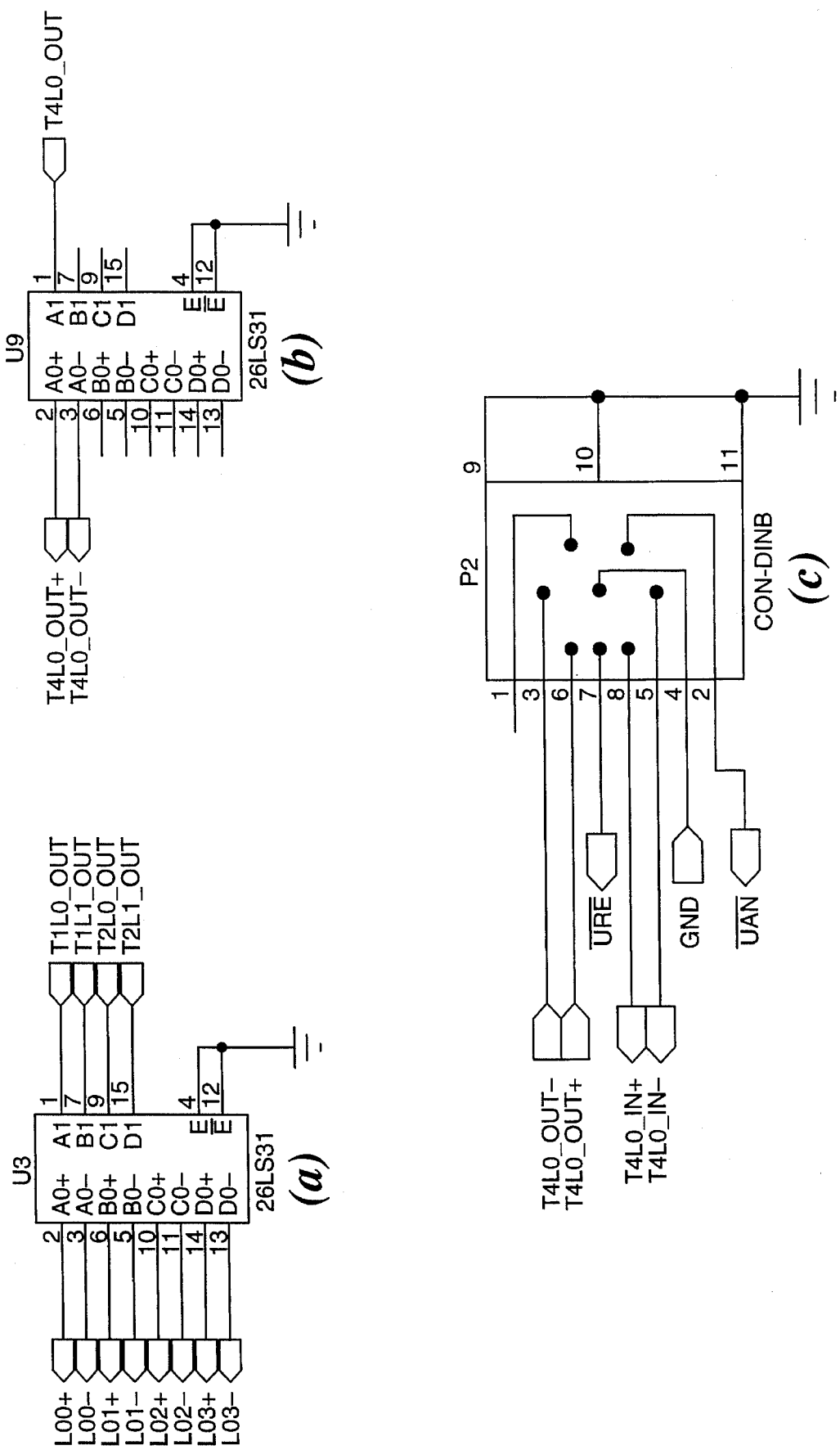
Figure 11:
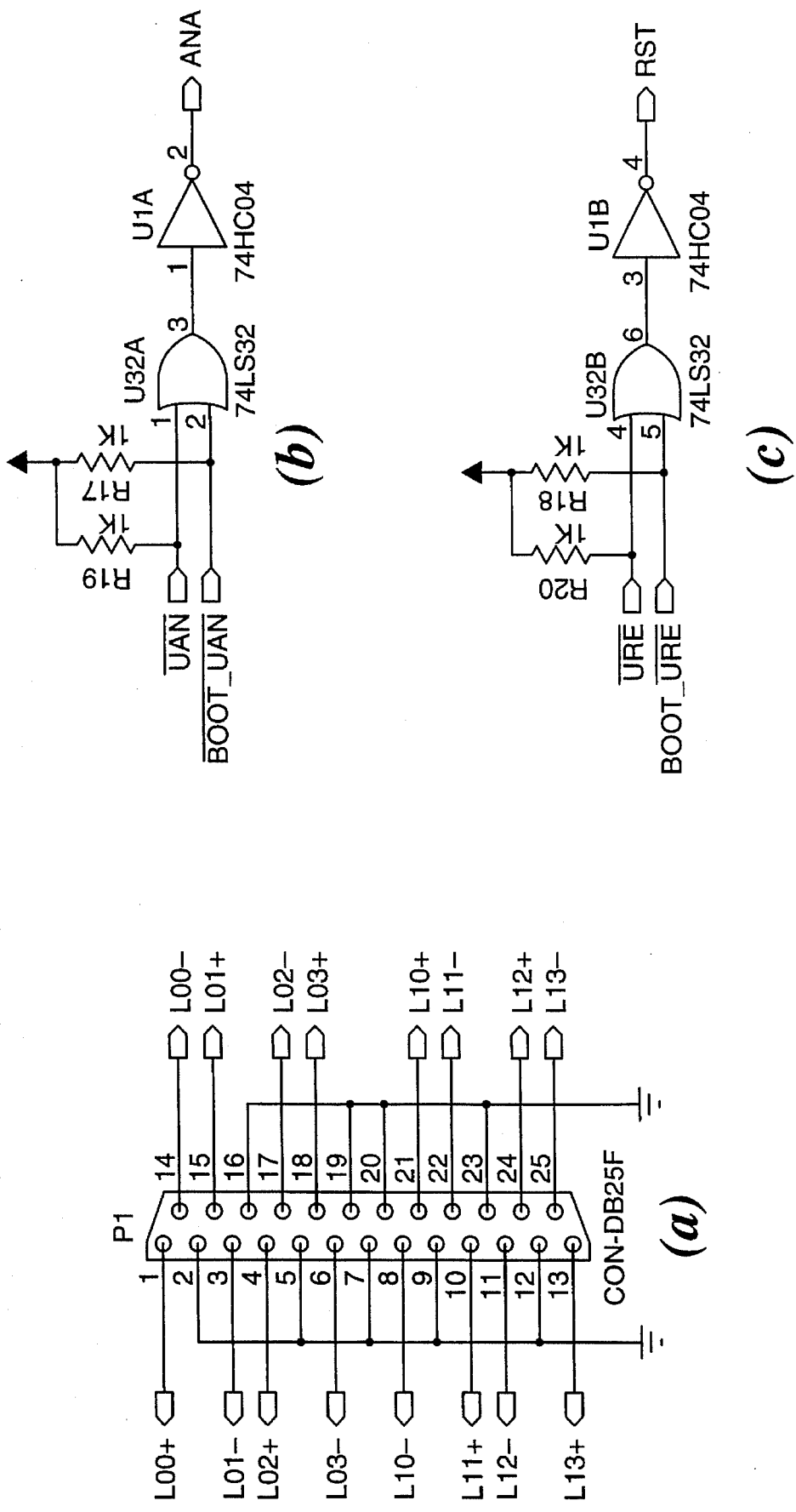
Figure 12:
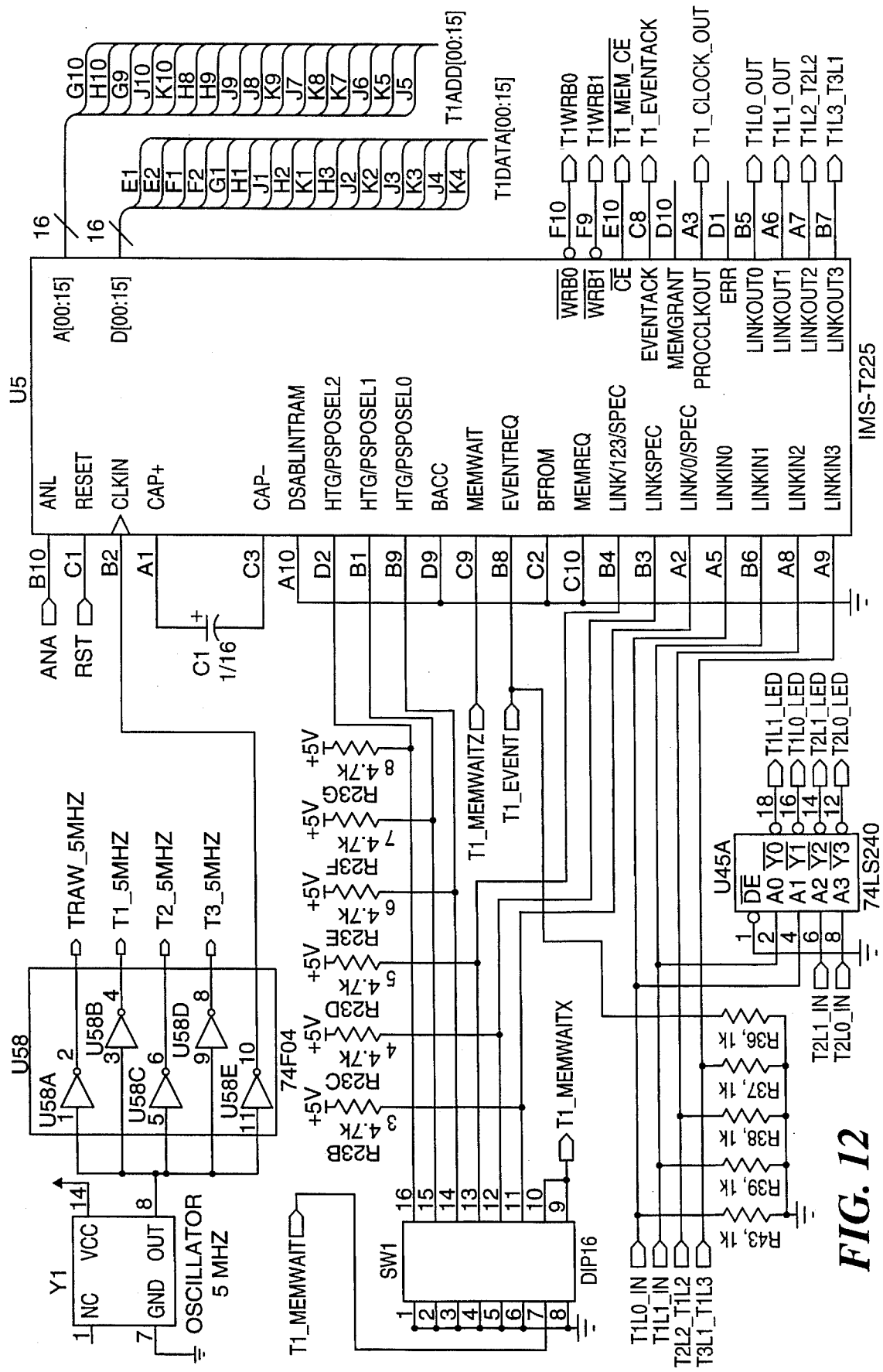
FIGS. 12 through 14 are hardware schematic diagrams illustrating a presently preferred embodiment of the parallel processor T4 and a data receiving portion of the channel service unit.

The link interface 34 is further illustrated by the flowcharts shown in FIGS. 3 through 5 and the process block diagrams in FIGS. 6 and 7. Those of skill in the art will appreciate that certain portions of the data flow steps shown in FIGS. 3 through 5 are preferably accomplished substantially in parallel. For instance, steps accomplished by data reading and data writing processes are performed substantially concurrently by at least two parallel processors.

With reference to FIGS. 1 and 2, during remote mirroring several tasks are generally performed by the data transfer units 30, 40. Mirrored data is moved from the server 10 to the primary DTU 30. The data is moved from the primary DTU 30 to the communication link 50. The data is moved from the communication link 50 to the remote DTU 40, and from the remote DTU 40 to the remote disk 20. In addition, an acknowledgement may be generated and sent to the primary server 10 indicating that the data has been received.

With reference now to FIGS. 1, 2, 3, and 6, the task of moving data from the server 10 to the primary DTU 30 is presently accomplished by moving each packet of data sent from the server 10 as follows. A process in T4 reads half of the waiting packet's header from the server 10, while a substantially parallel (i.e., concurrent) process in T3 reads the other half of the header. T4 then transmits at least a portion of its half of the packet header to T3.

Figure 13A:
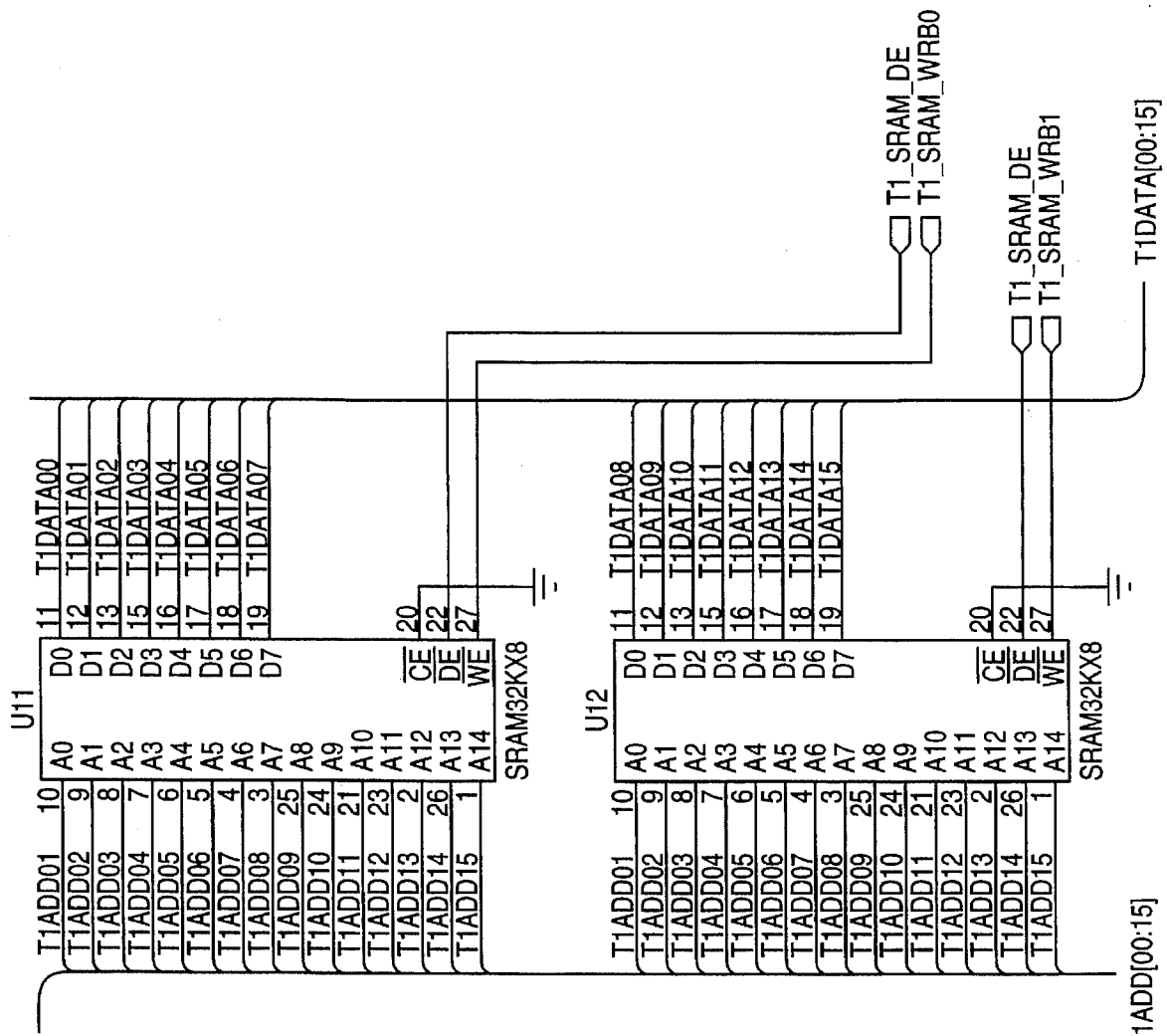
Figure 13B:
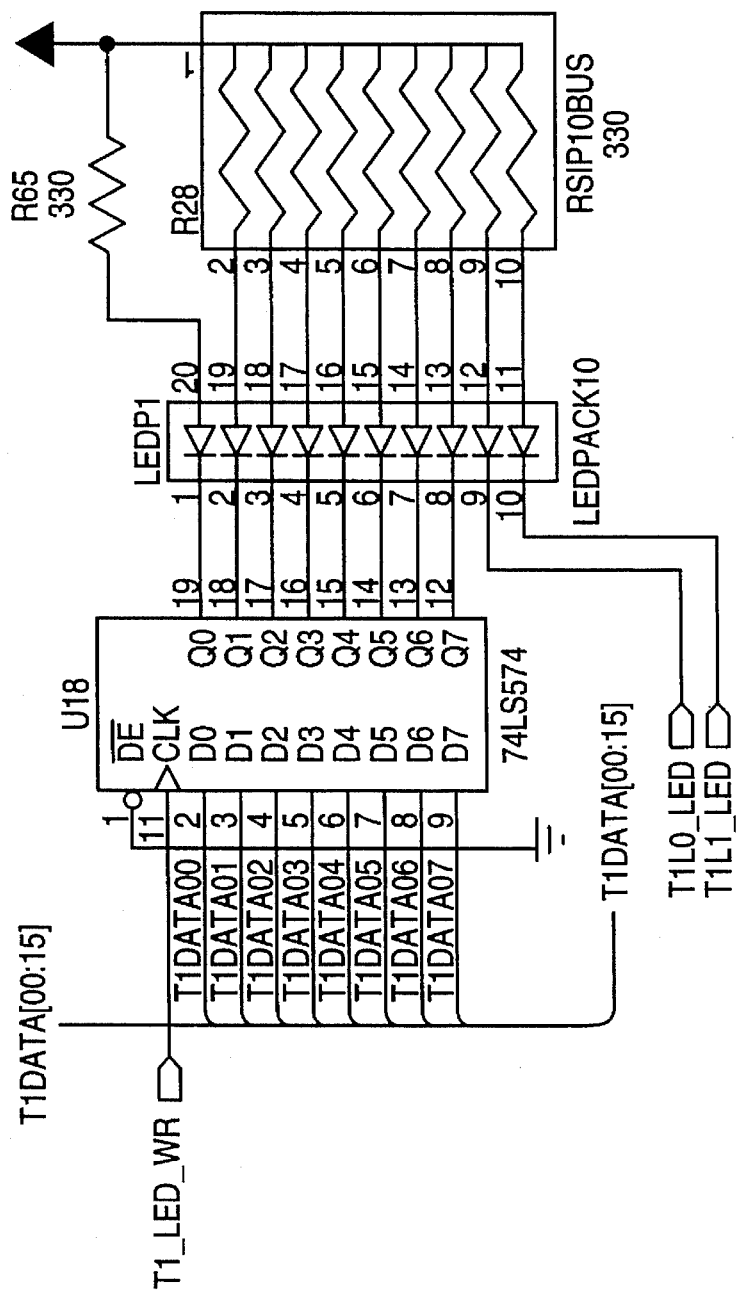
Figure 14:
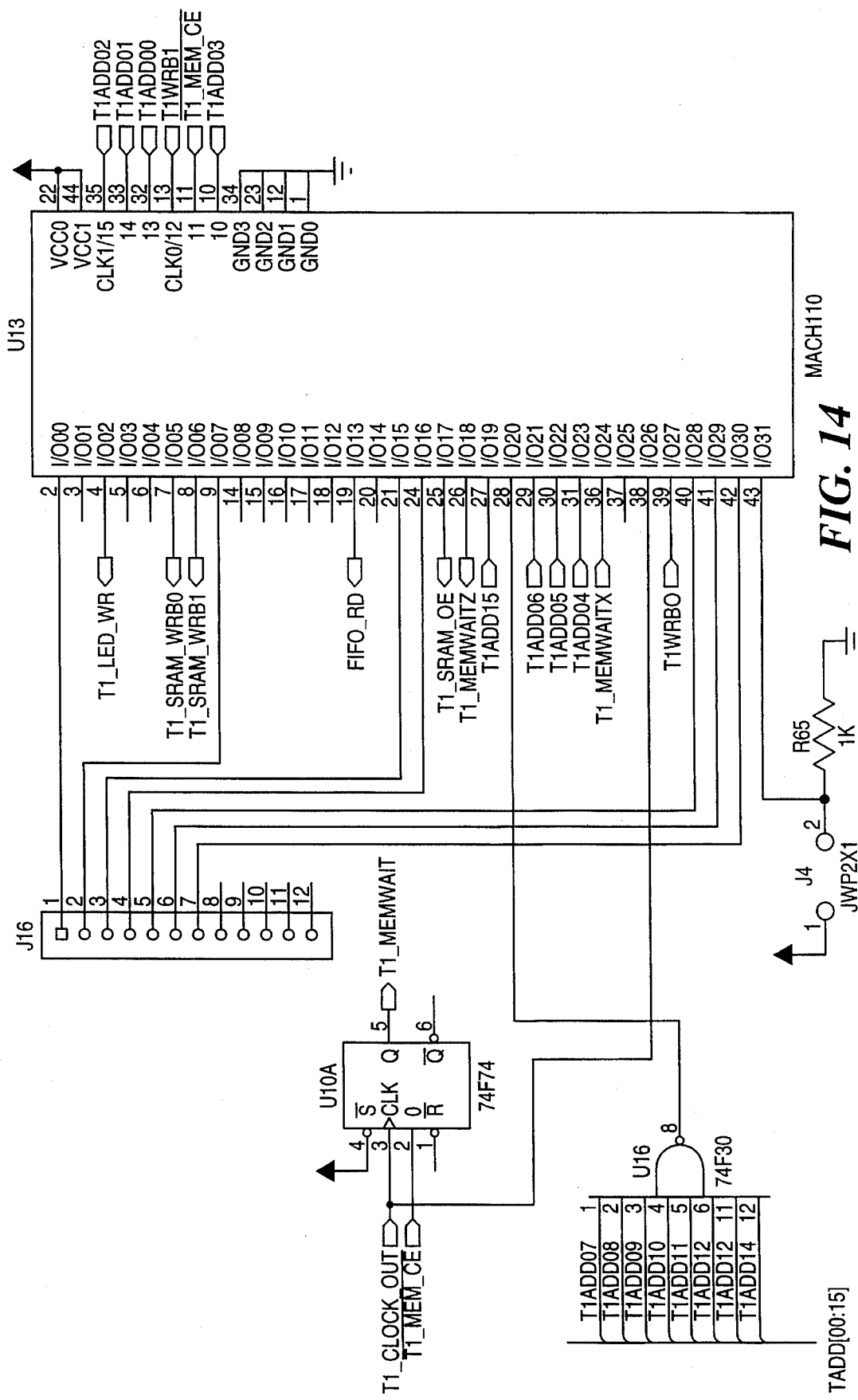
Figure 15:
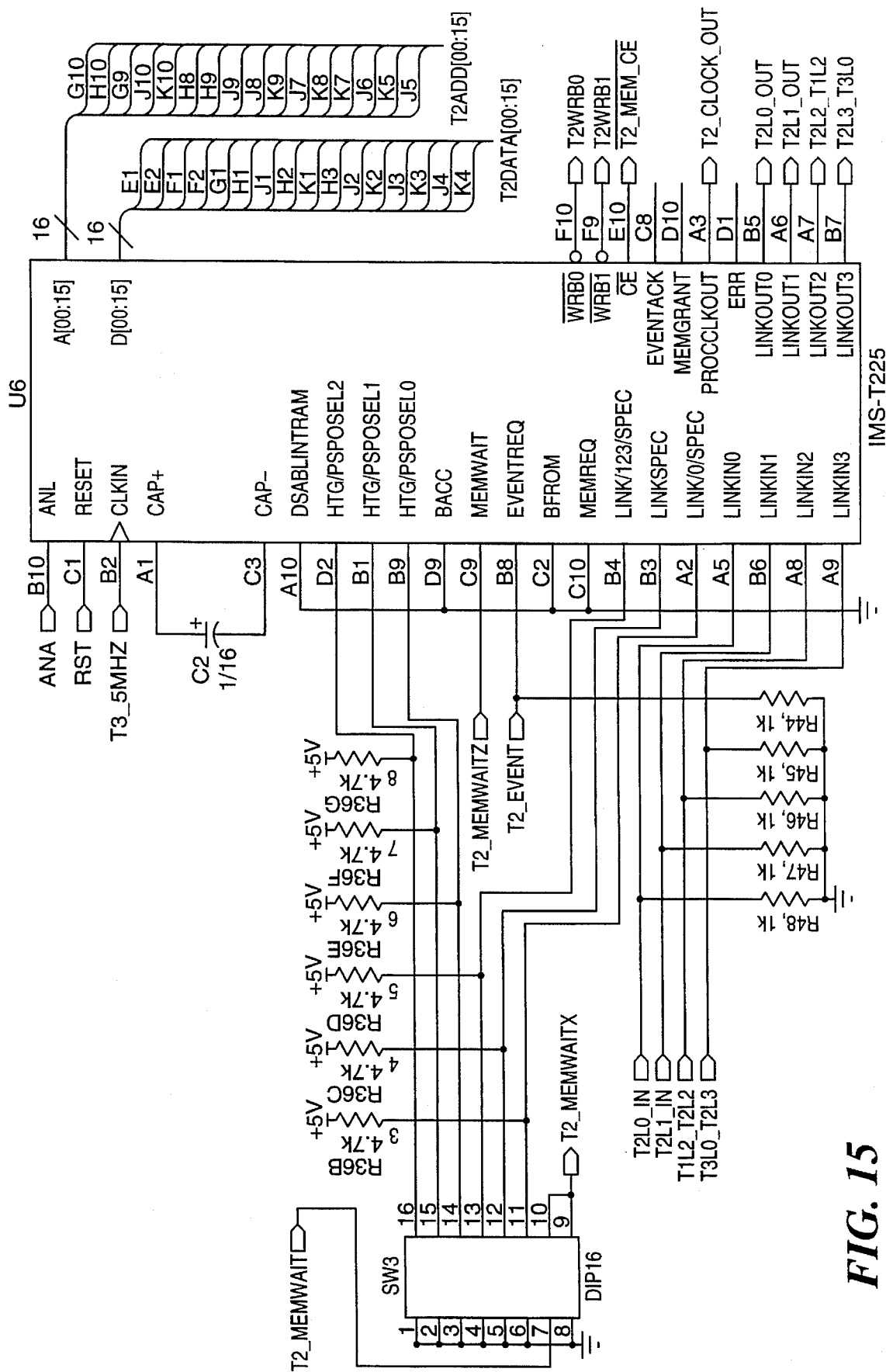
FIGS. 15 through 19 are hardware schematic diagrams illustrating a presently preferred embodiment of the parallel processor T3 and a control portion of the channel service unit.
Figure 16:
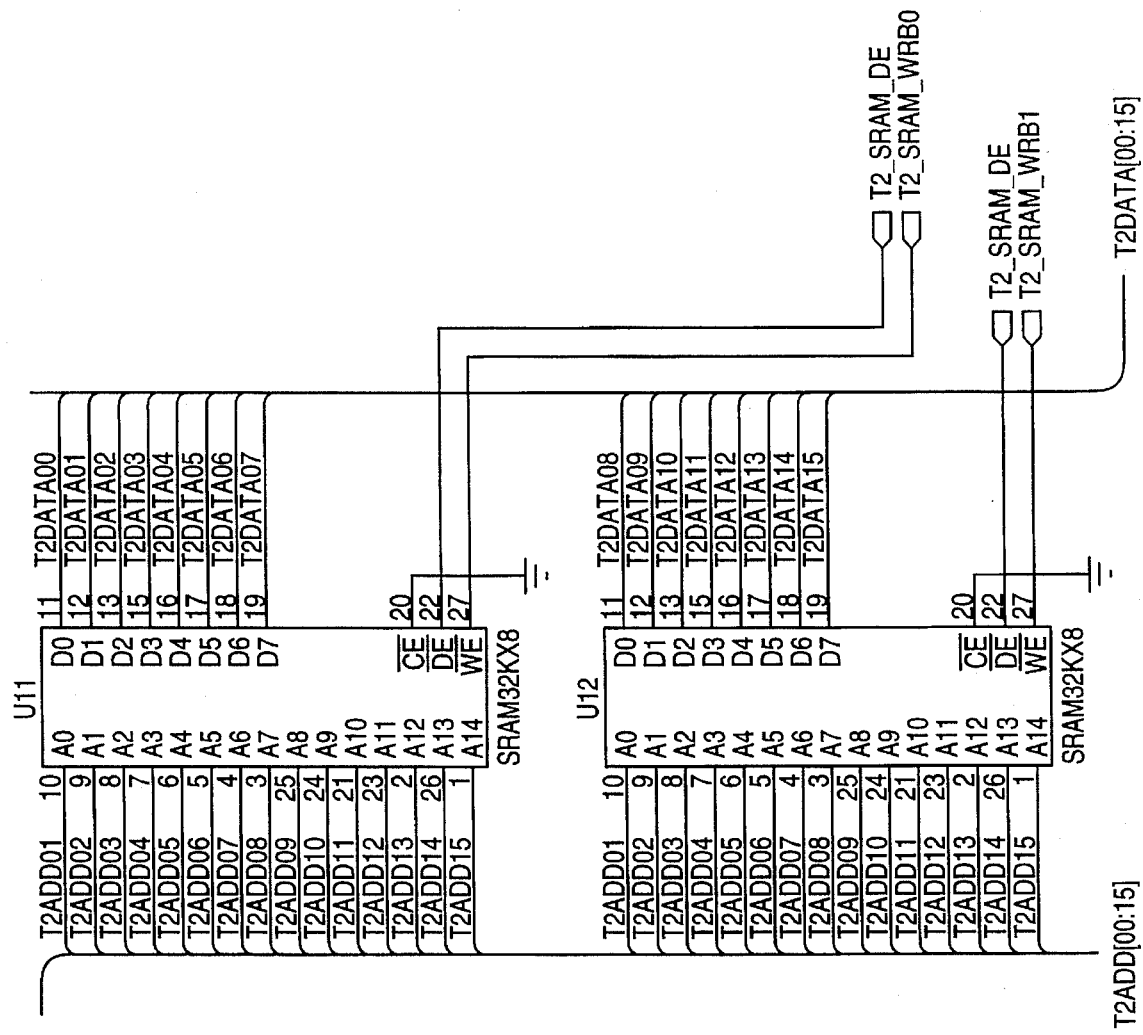
Figure 17:
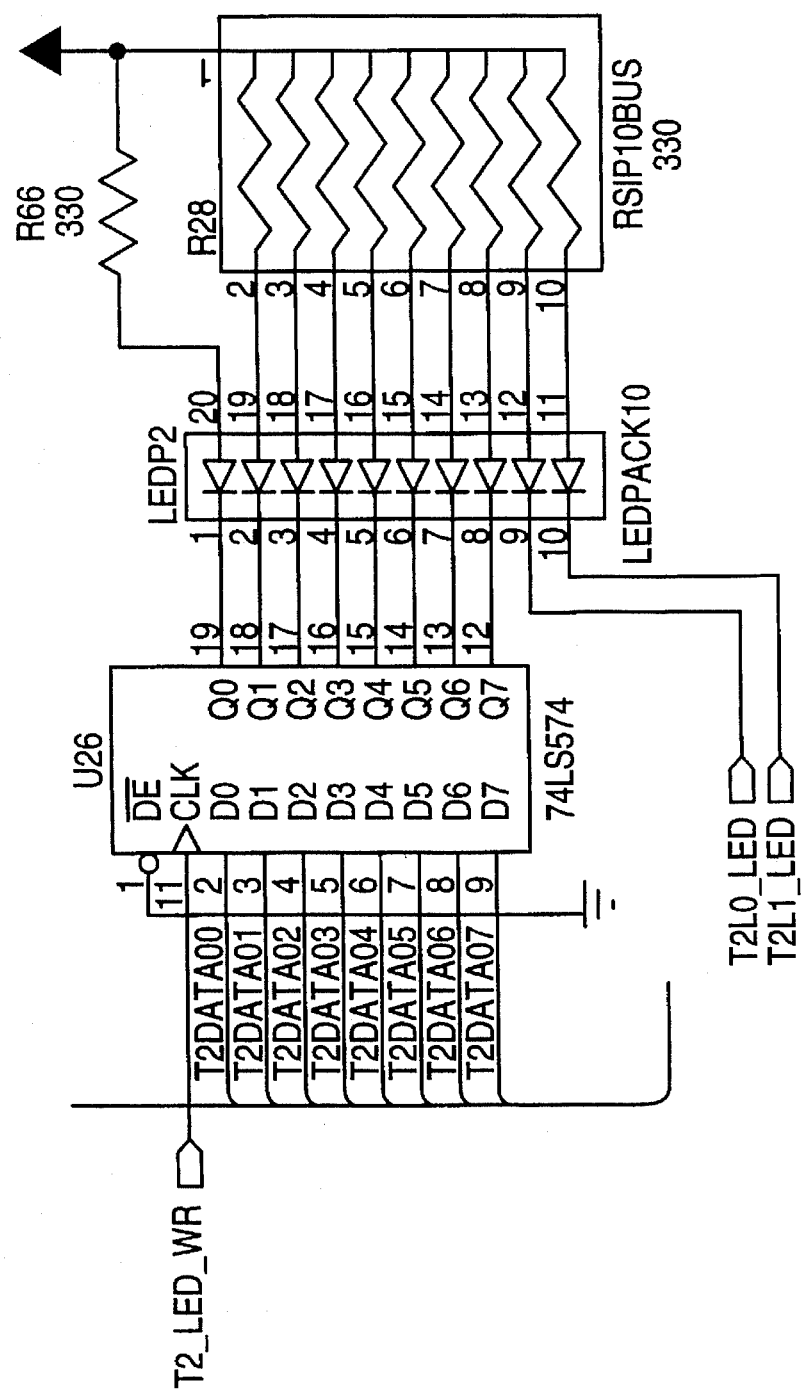
Figure 18:
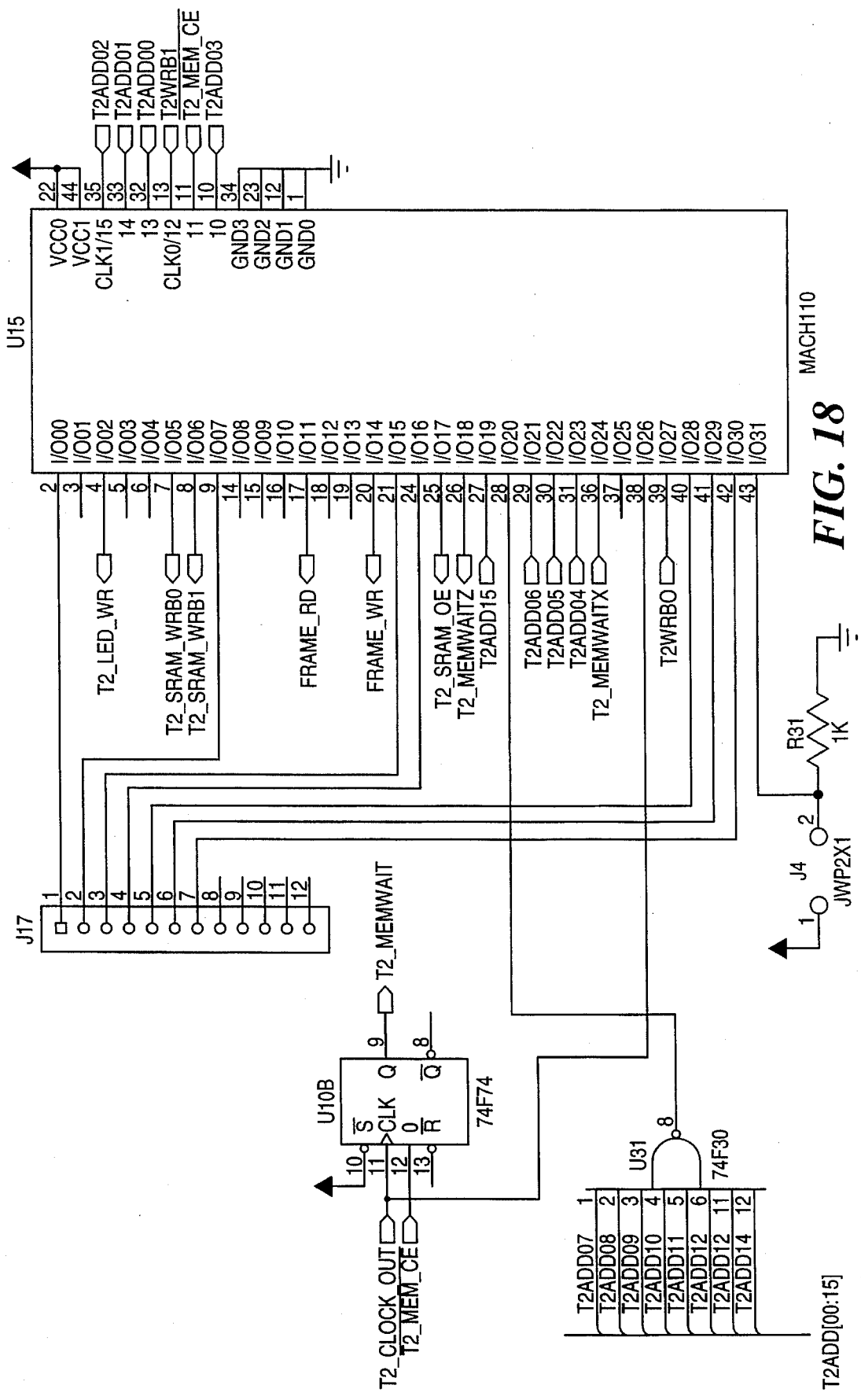
Figure 19:
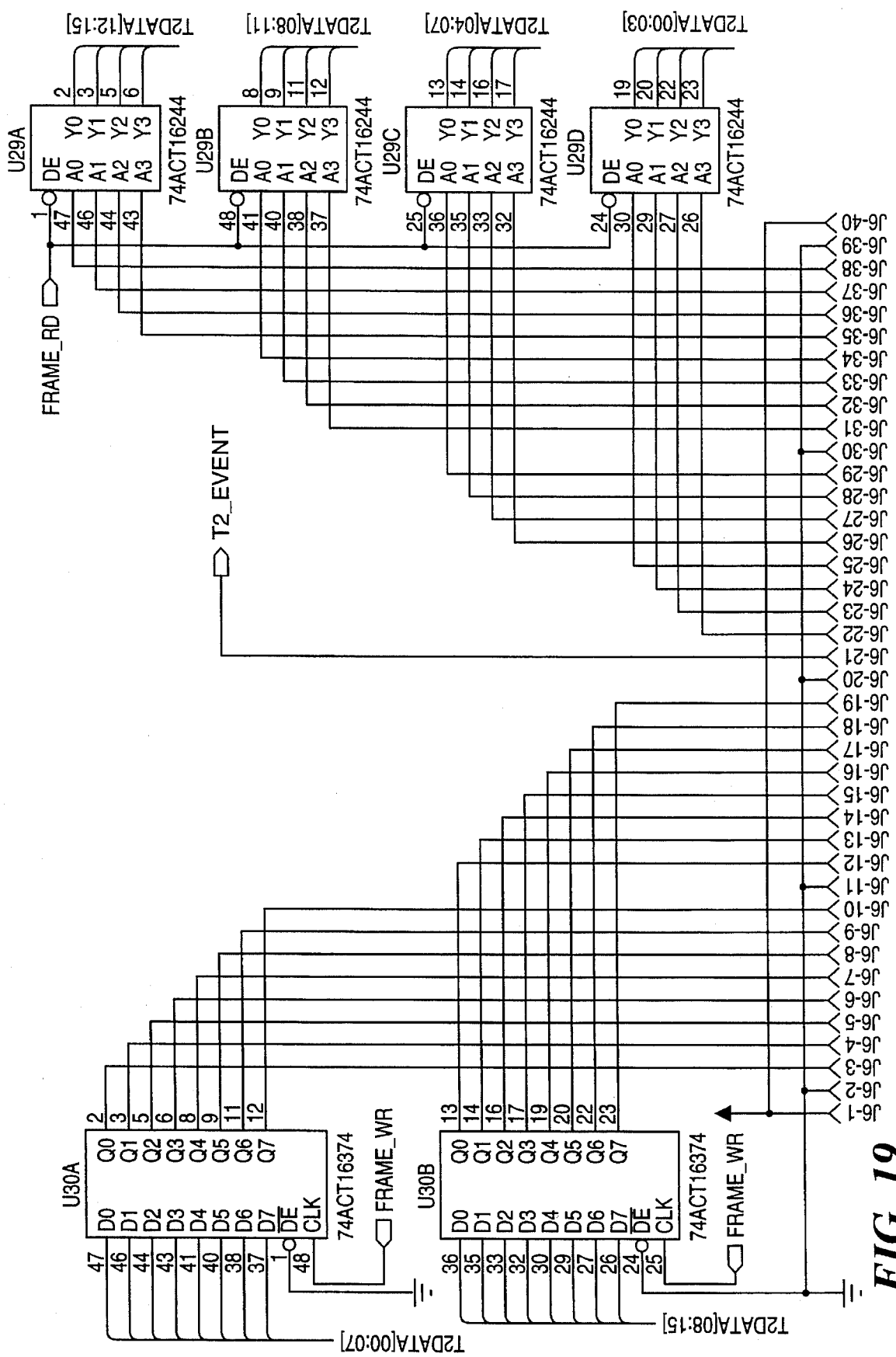
Figure 20:
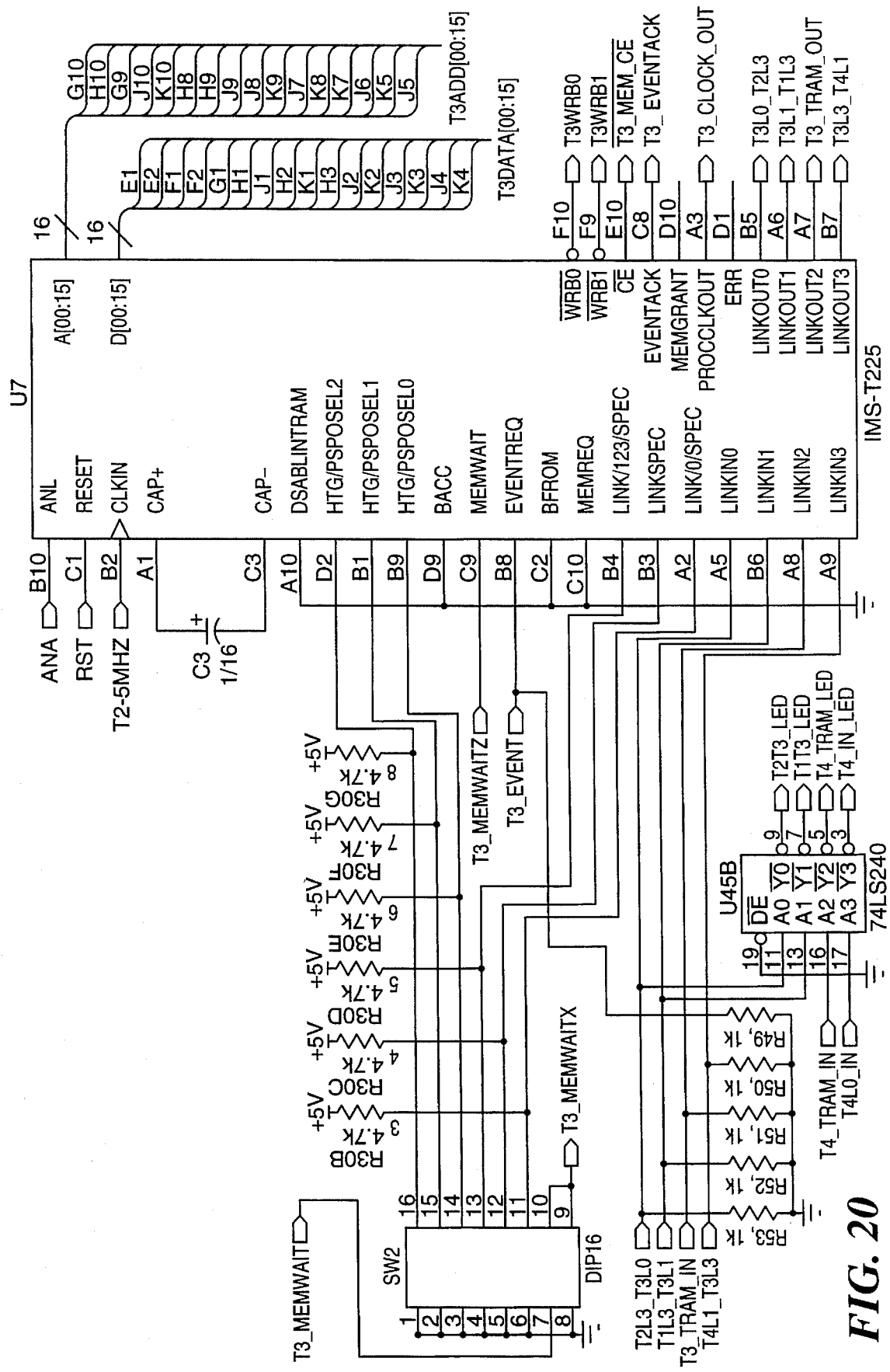
FIGS. 20 through 24 are hardware schematic diagrams illustrating a presently preferred embodiment of the parallel processor T2 and transmit and IDE portions of the channel service unit.
Figure 21:
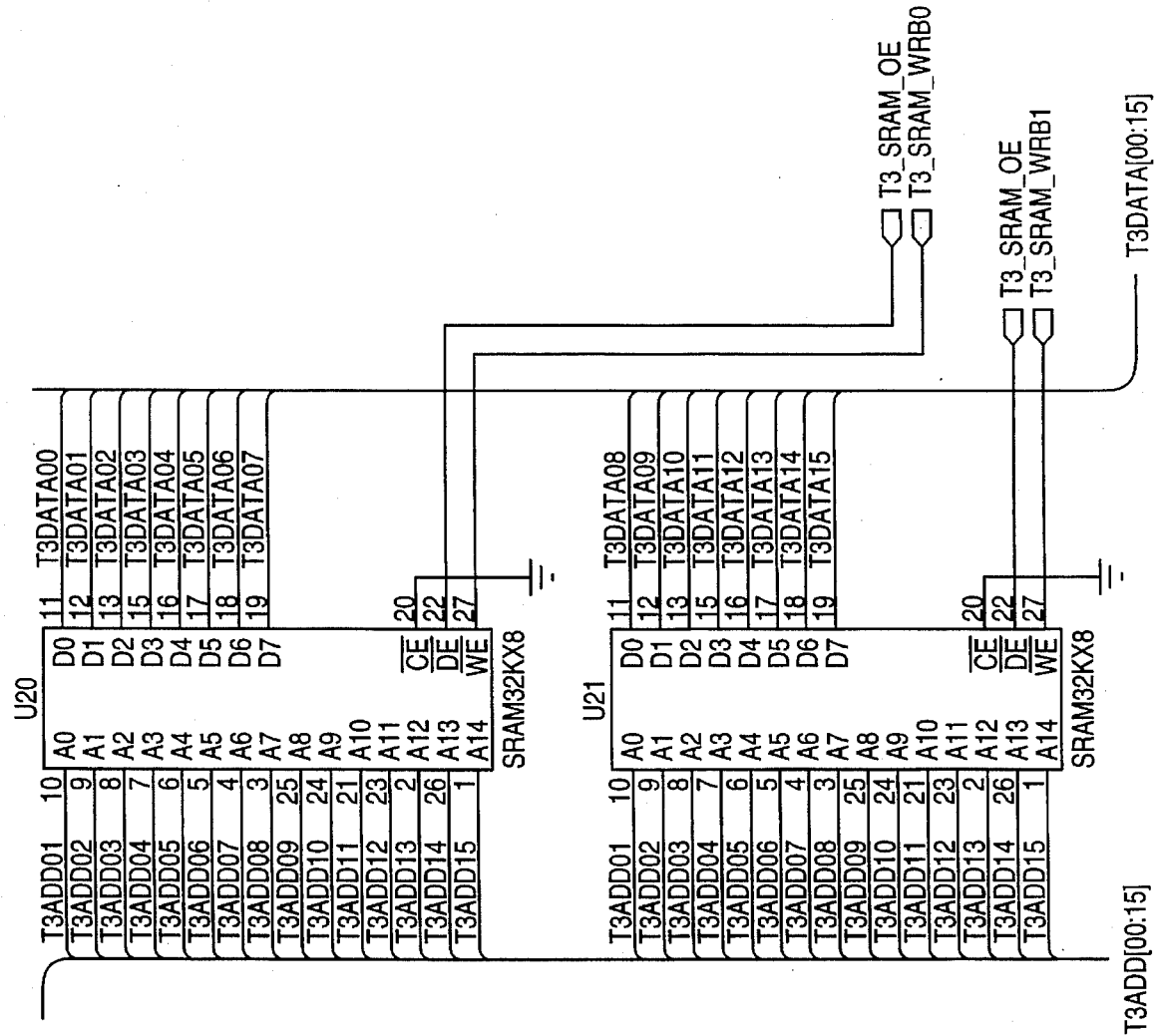
Figure 22:
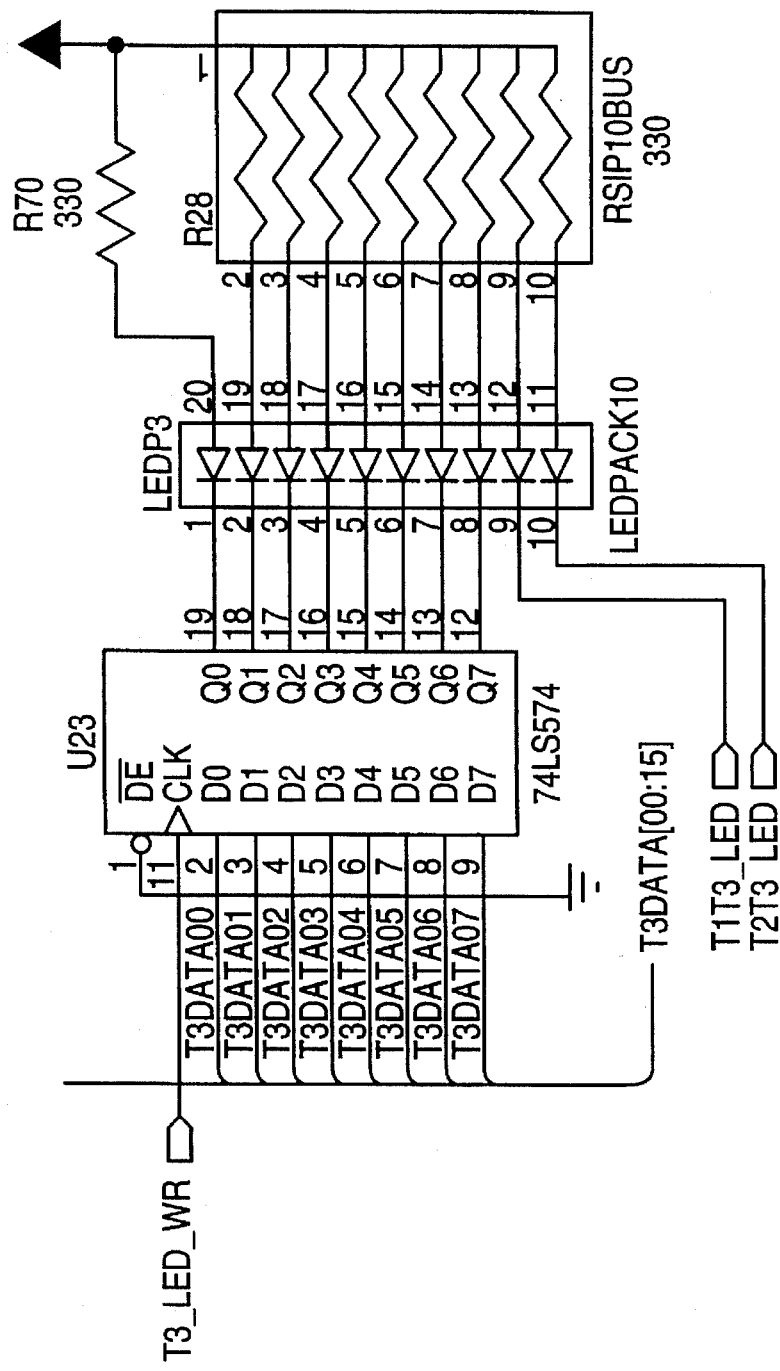
Figure 23:
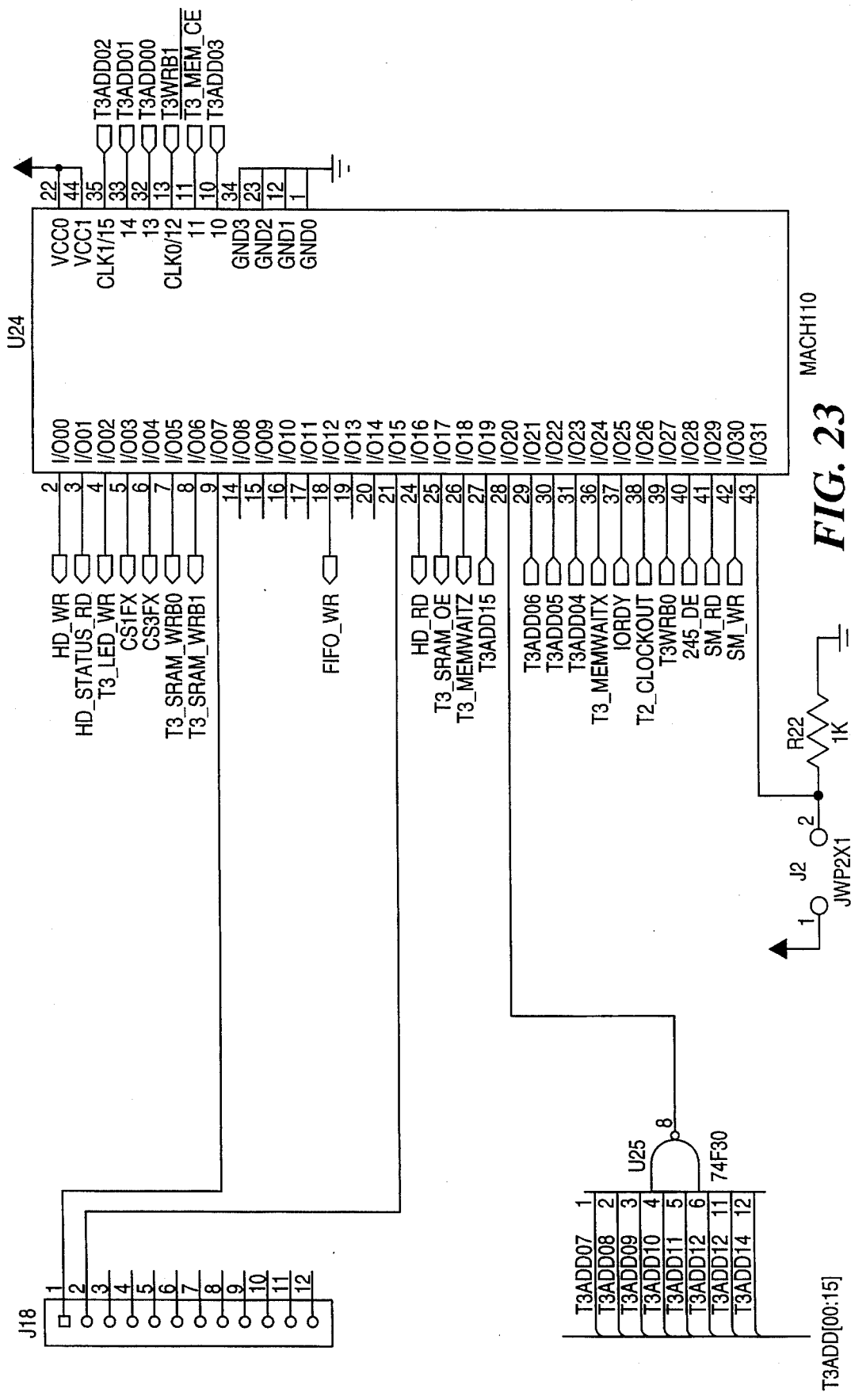
Figure 24:
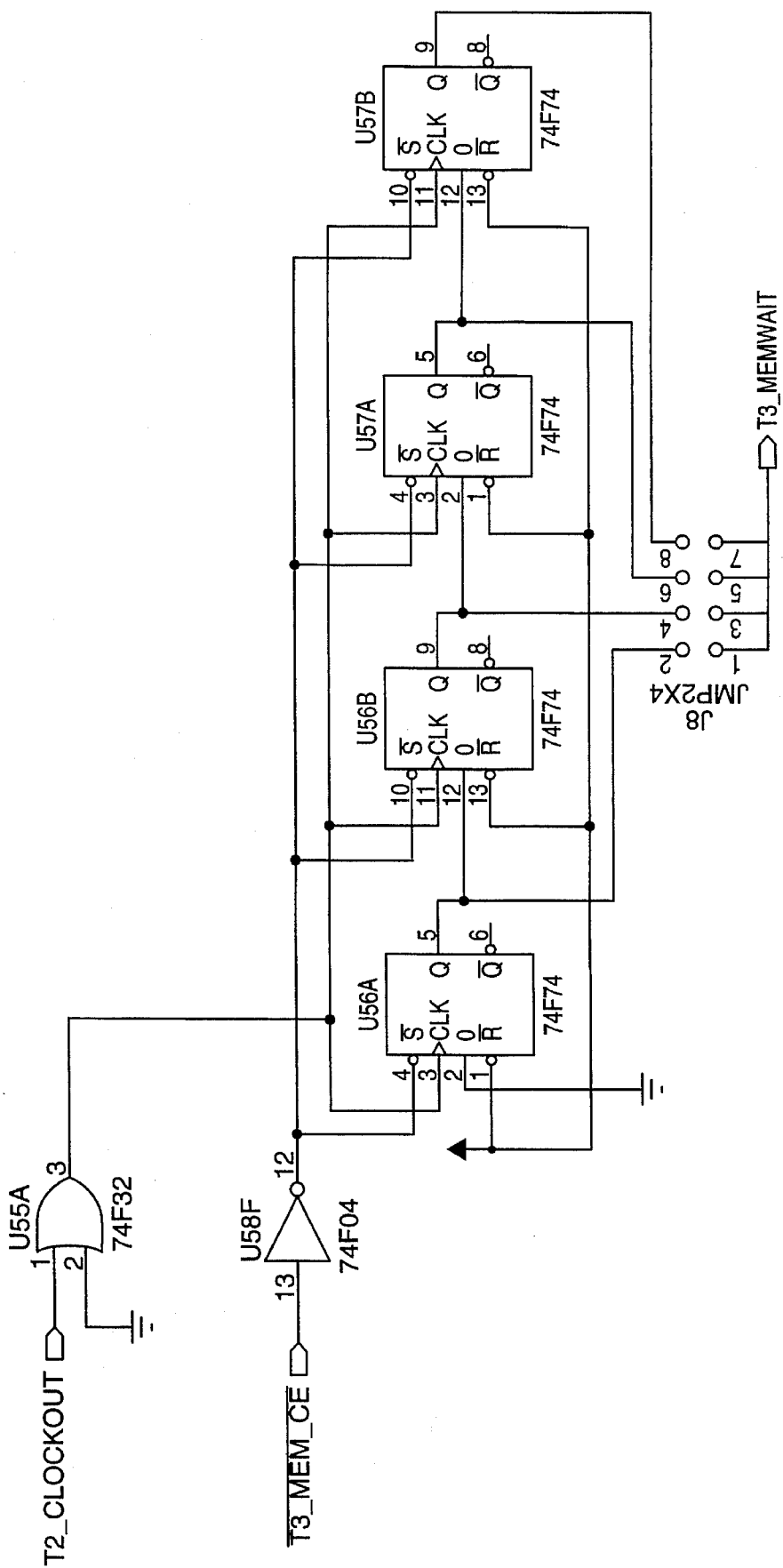
Figure 25:
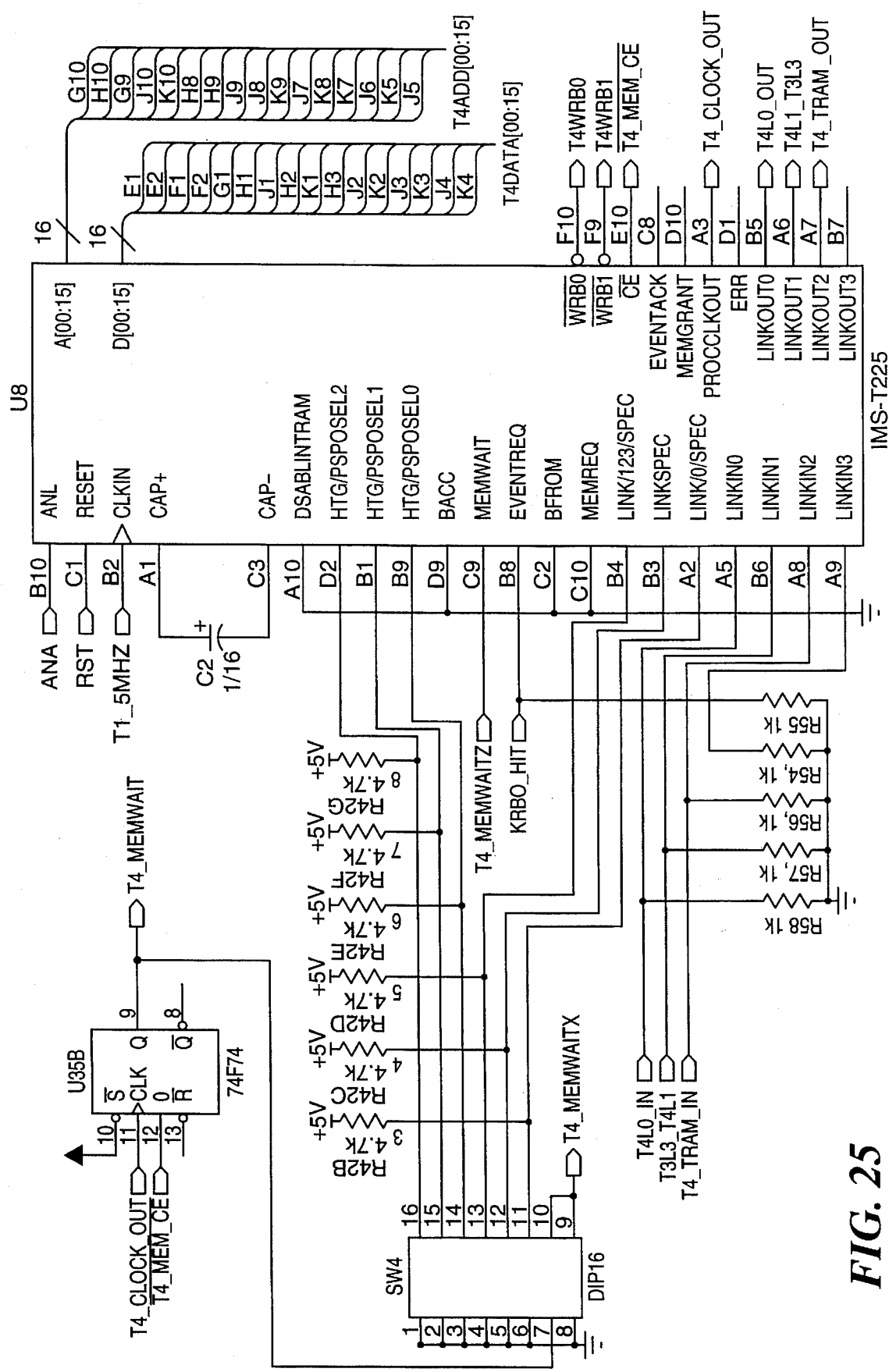
FIGS. 25 through 29 are hardware schematic diagrams illustrating a presently preferred embodiment of the parallel processor T1, I/O circuits, and boot module.
Figure 26:
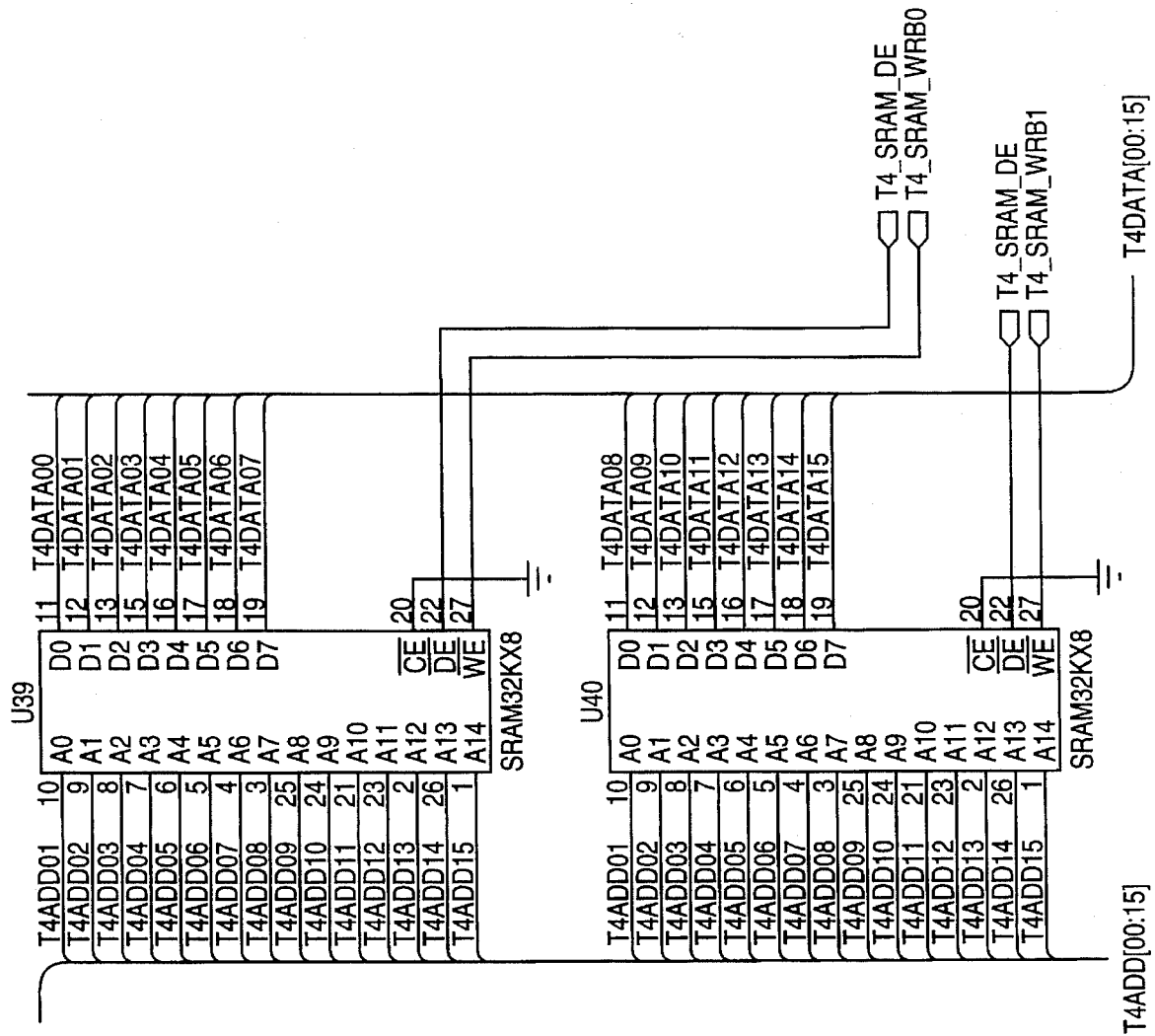
Figure 27:
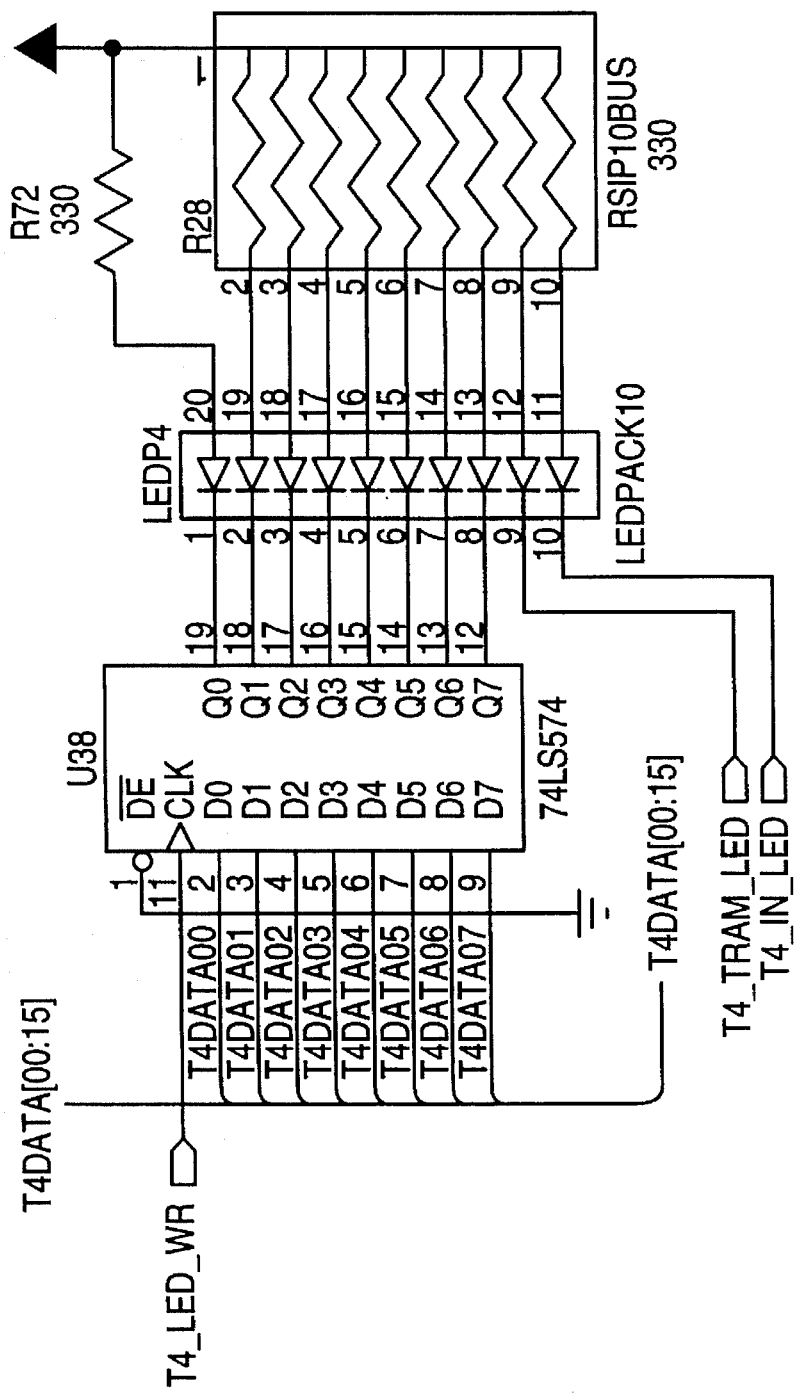
Figure 28:
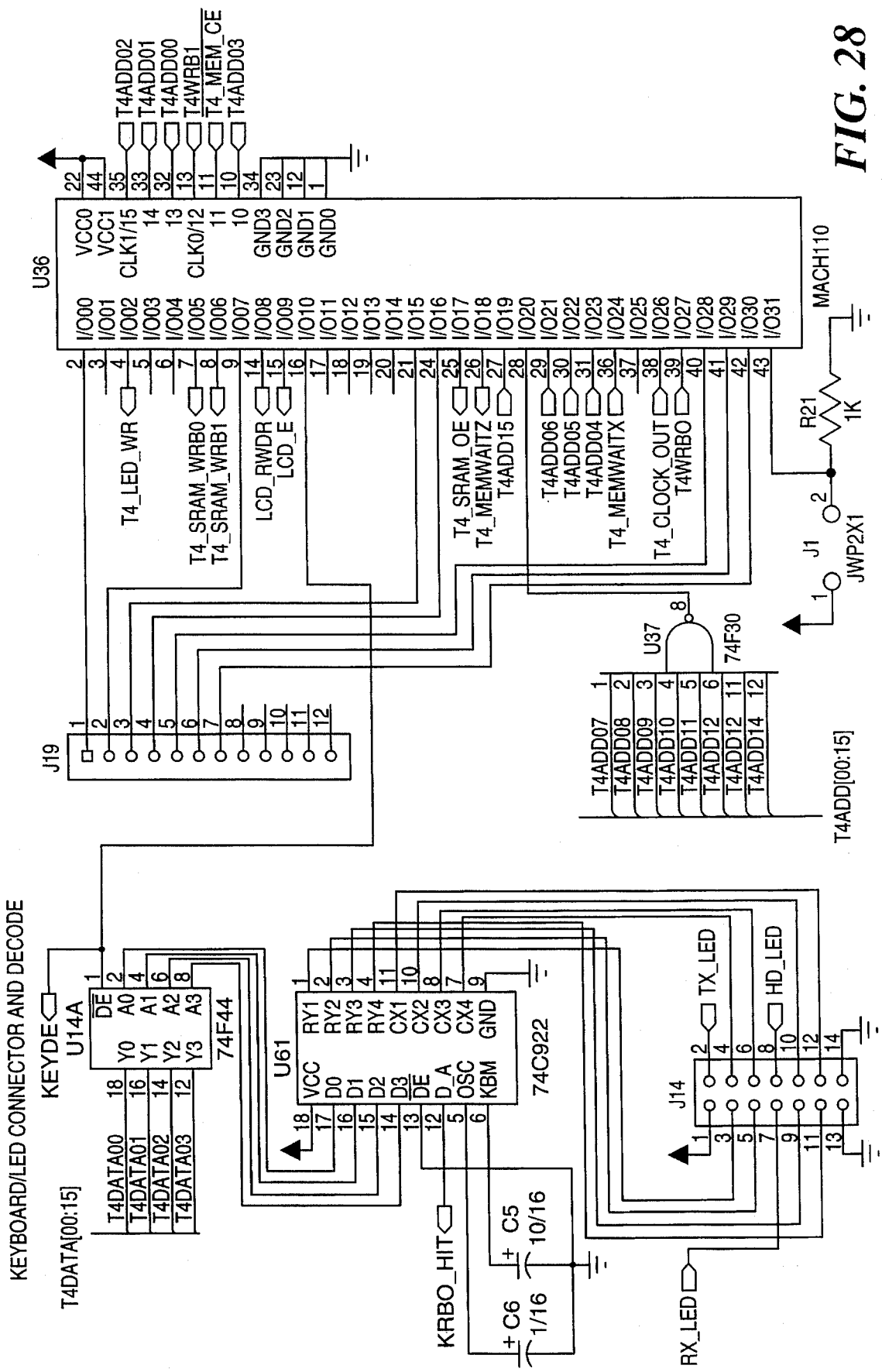
Figure 29:
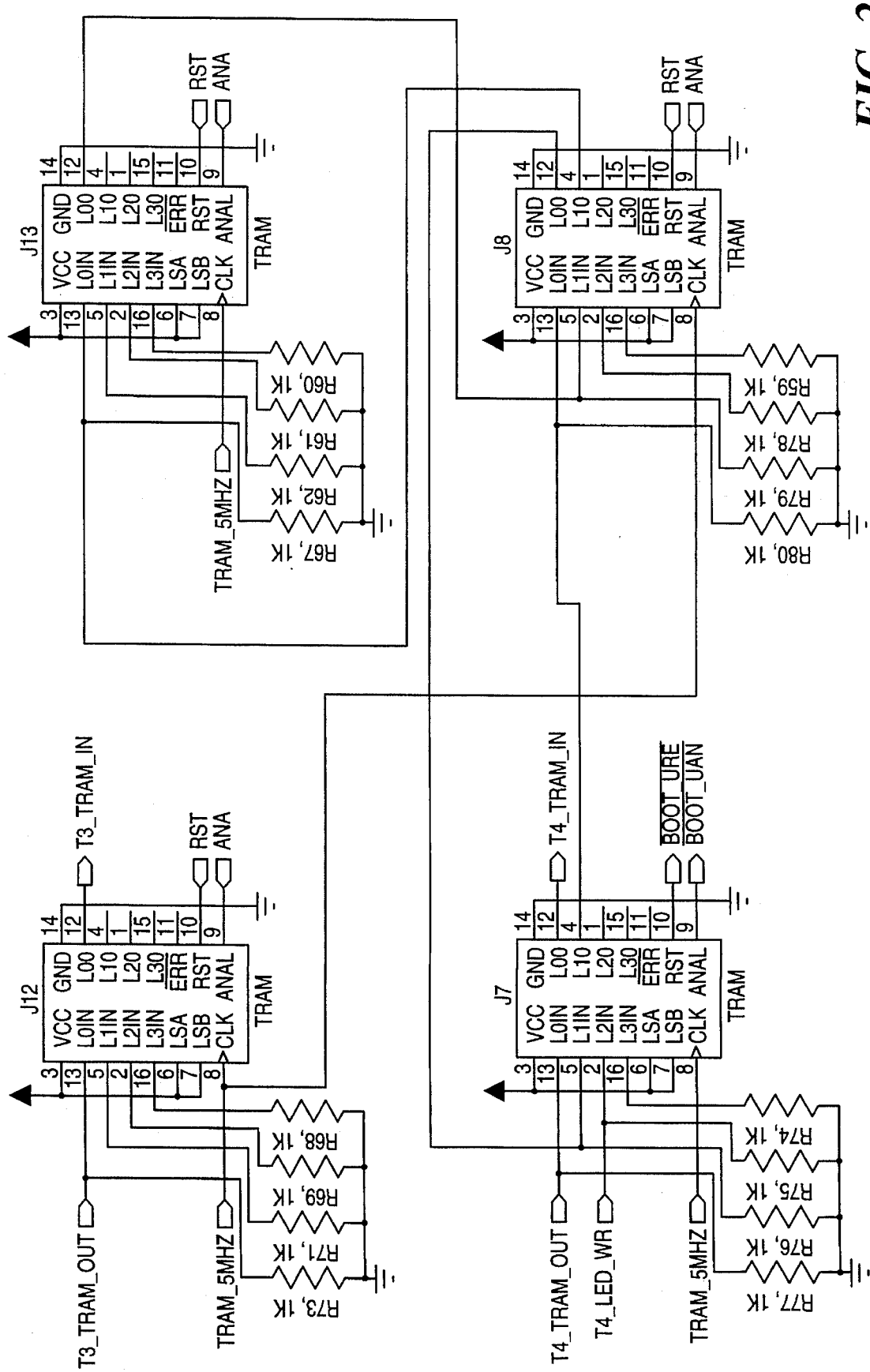
Figure 30:
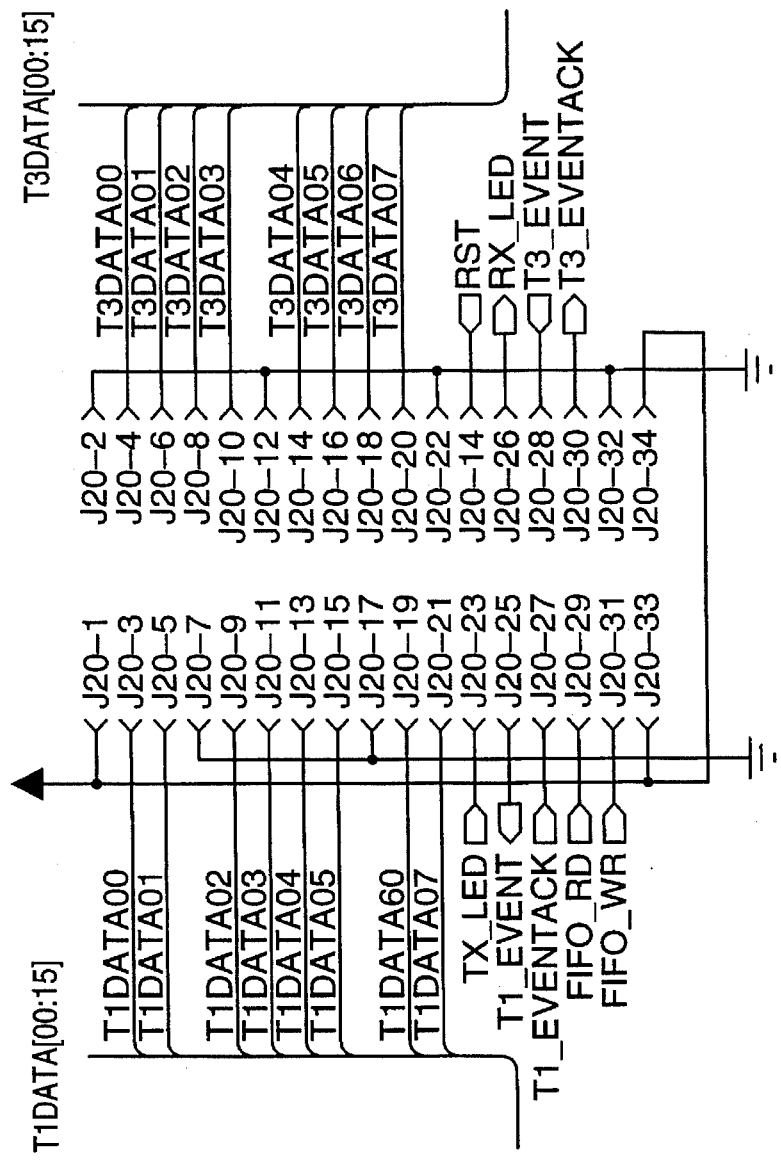
FIGS. 30 and 31 are hardware schematic diagrams illustrating a presently preferred embodiment of a UART/T1 interface for connecting the link interface to a conventional T1 communication link.
Figure 31:
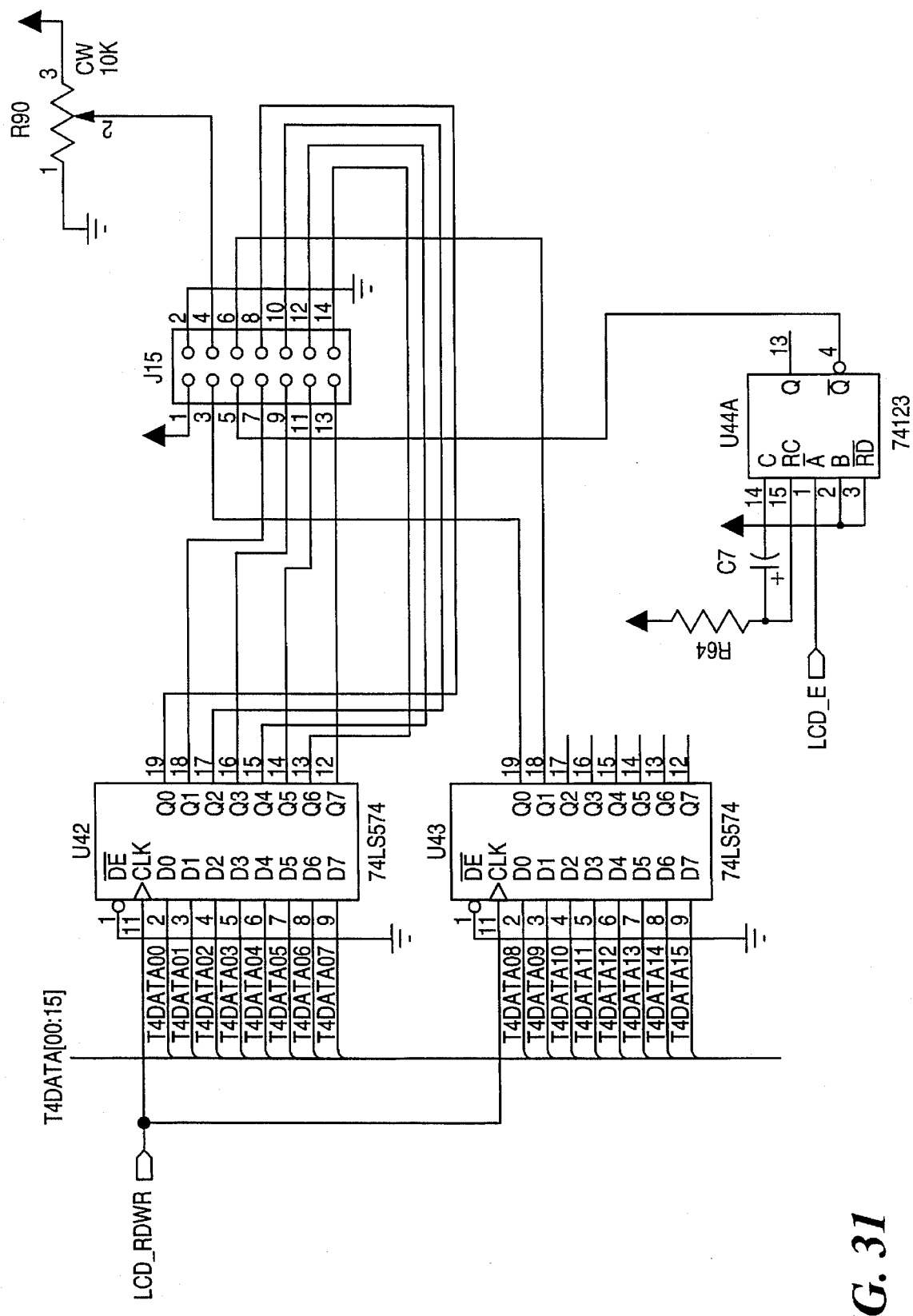
Figure 32:
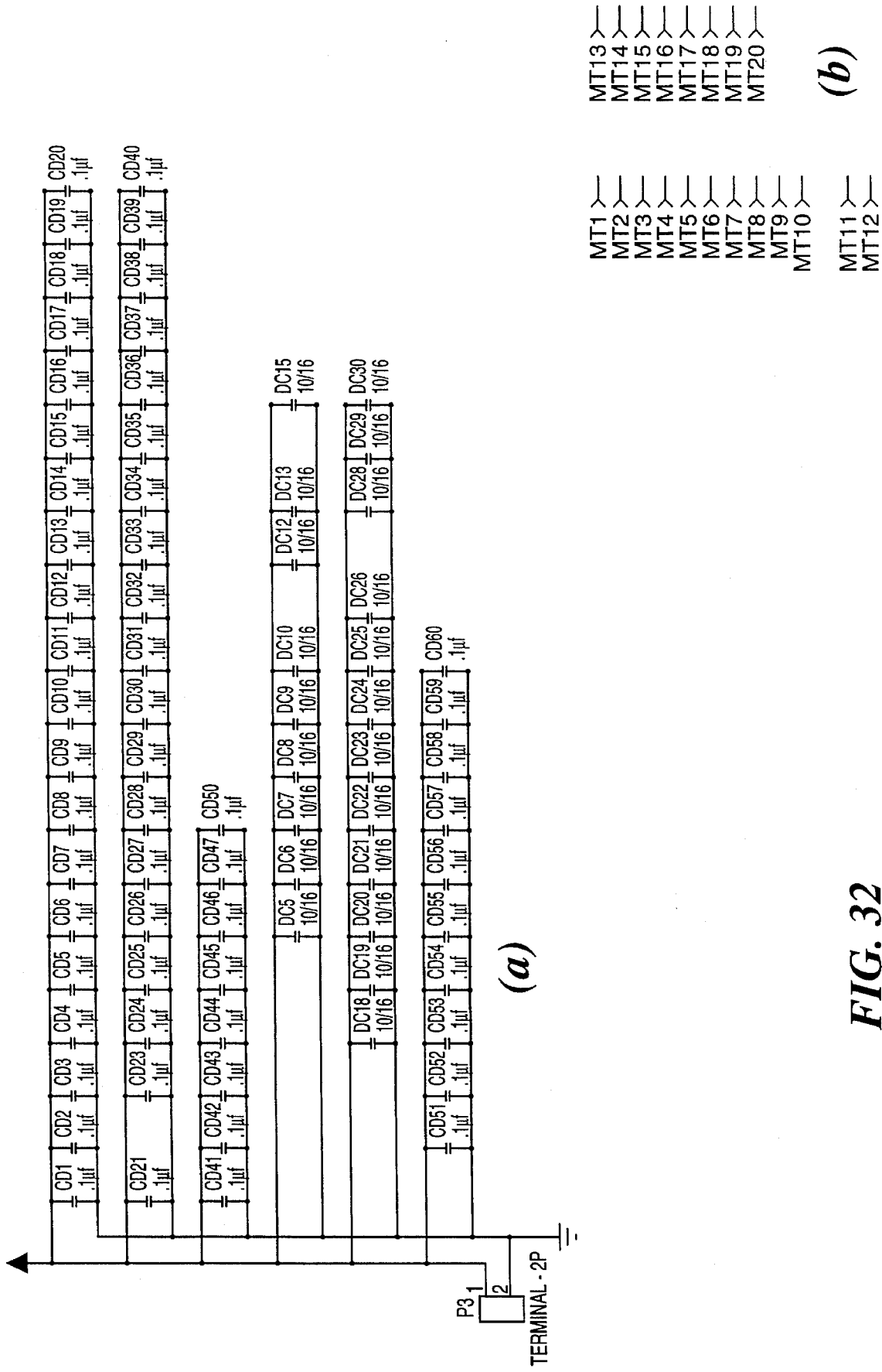
FIG. 32 is a hardware schematic diagram illustrating a presently preferred embodiment of decoupling and filter capacitors for use in the data transfer unit.
Figure 33:
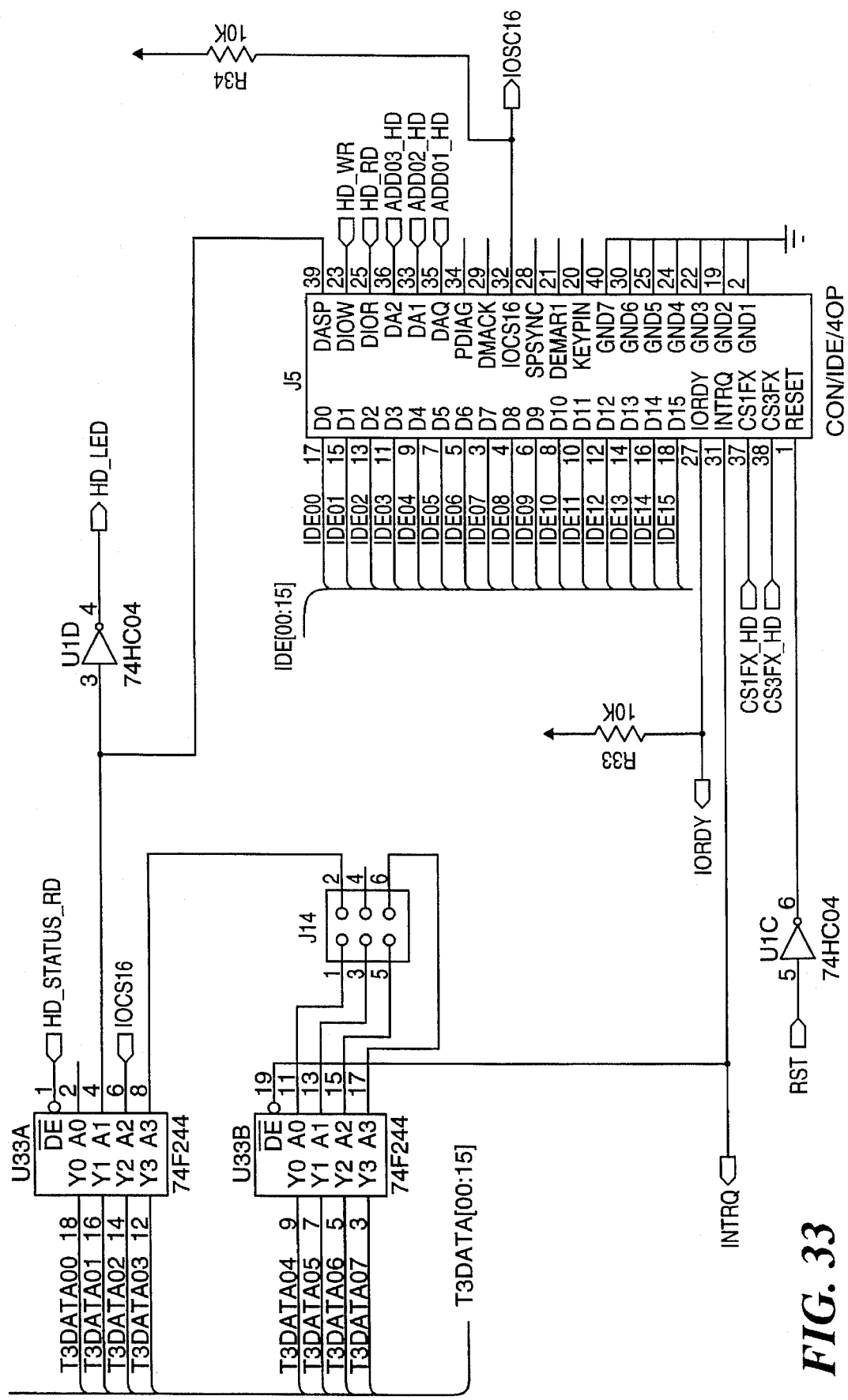
FIGS. 33 through 35 are hardware schematic diagrams illustrating a presently preferred embodiment of an IDE interface portion of the link interface.
Figure 34:
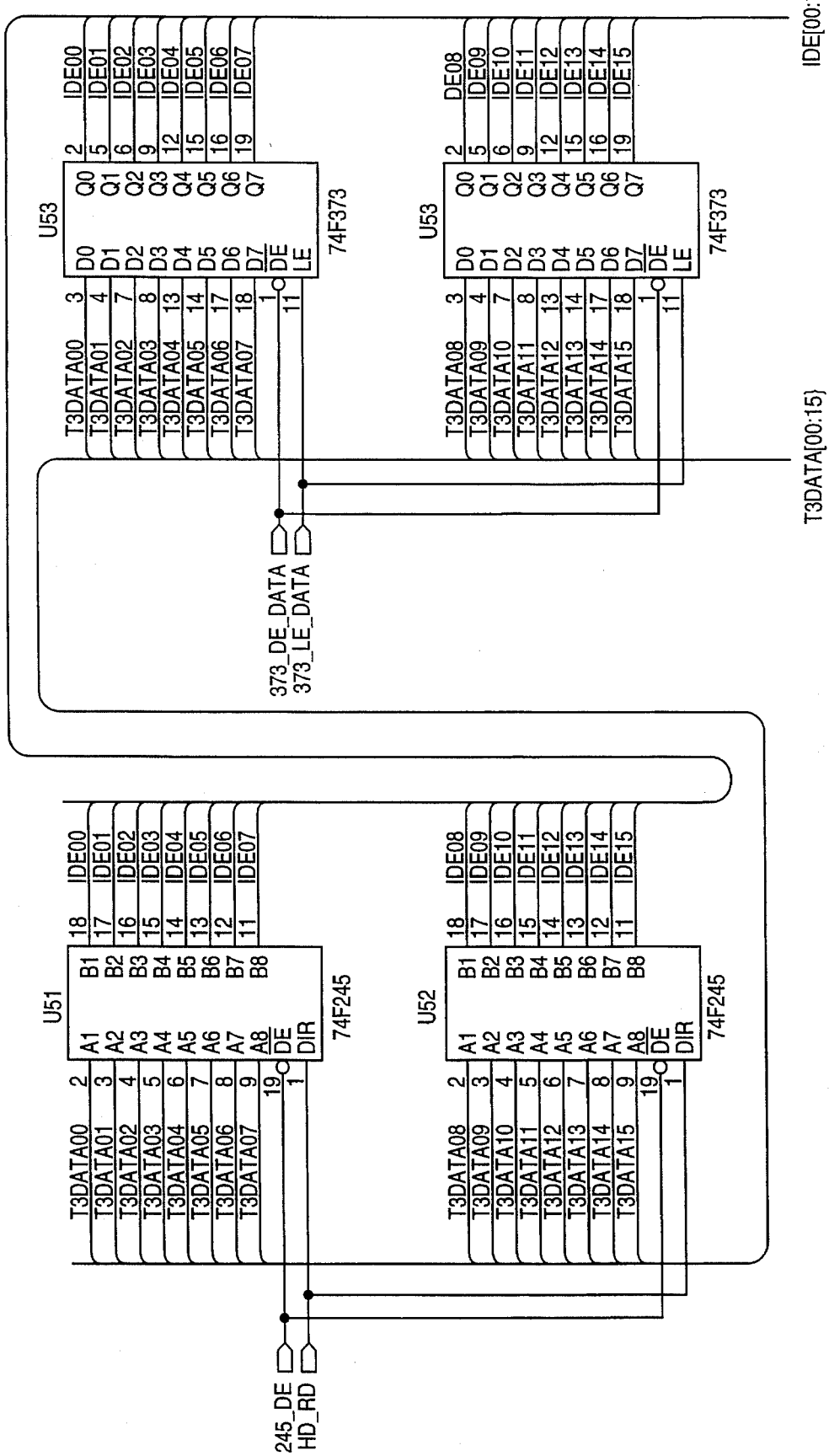
Figure 35:
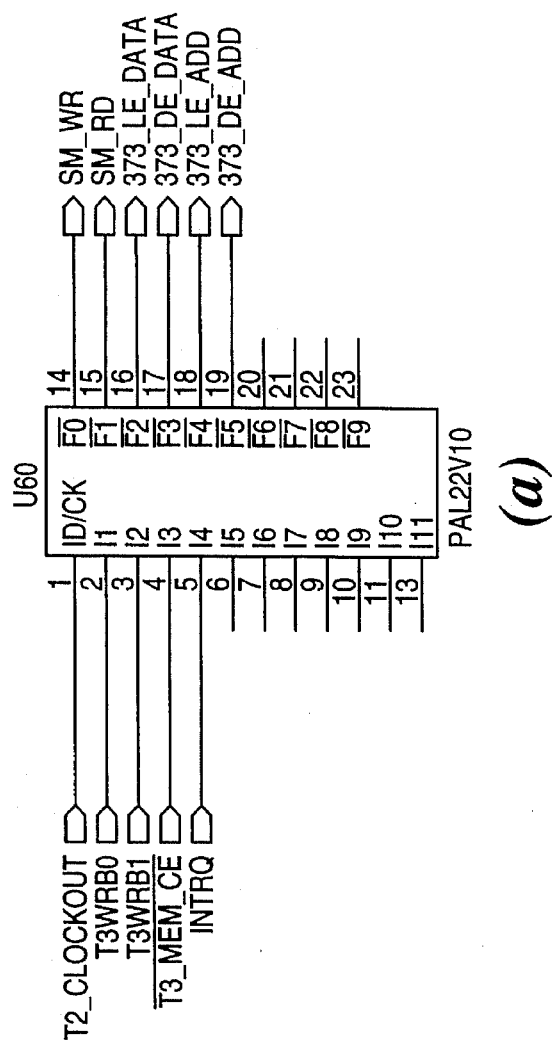
Figure 35:
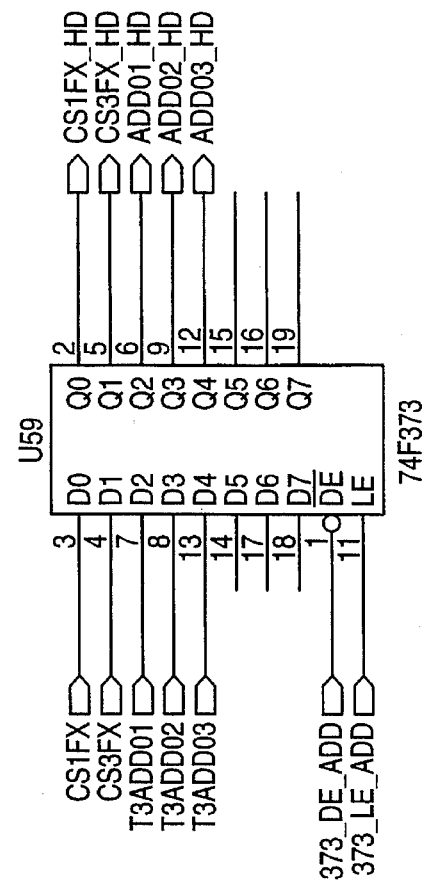
Figure 36:
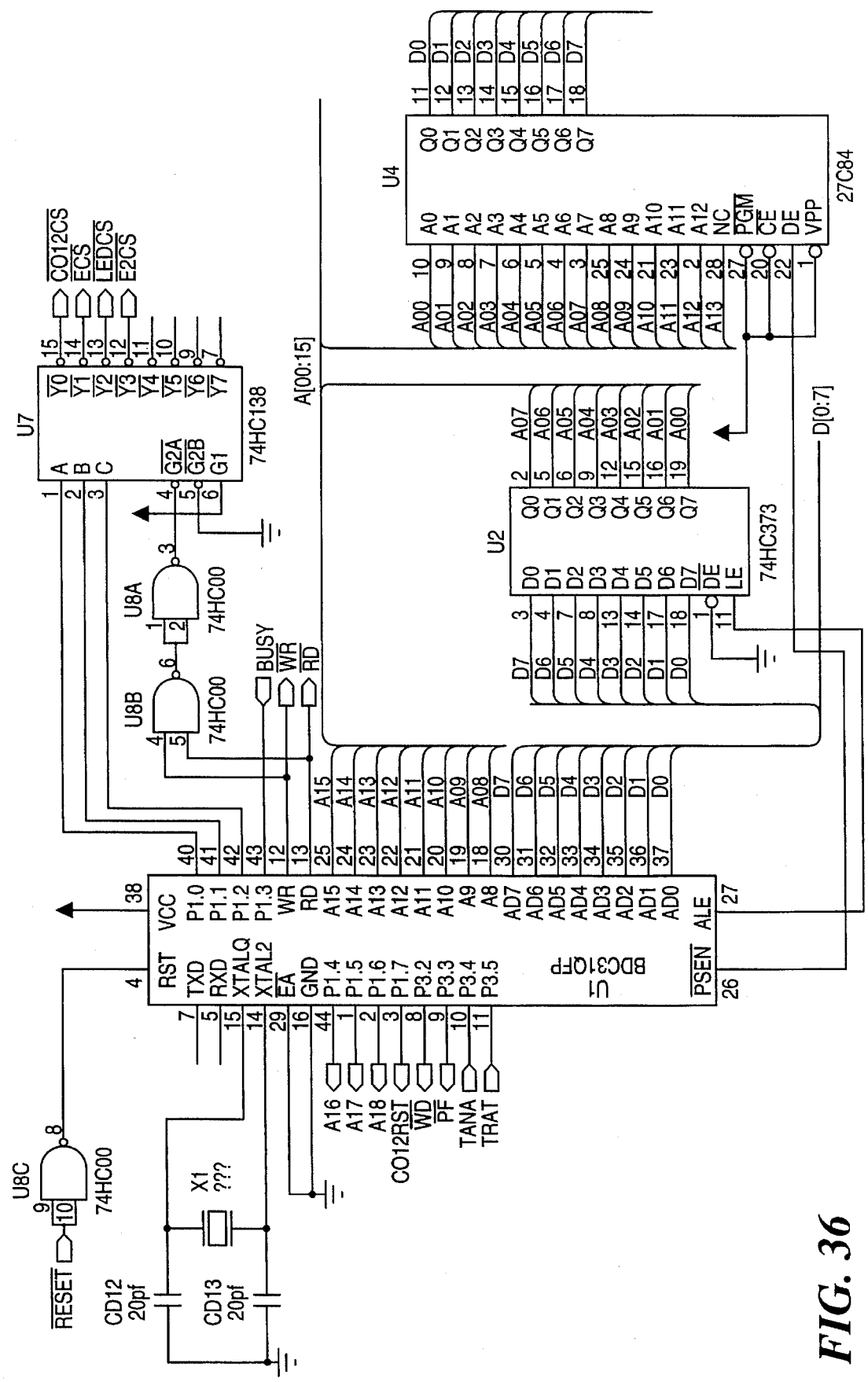
FIGS. 36 through 39 are hardware schematic diagrams further illustrating a presently preferred embodiment of the boot module.
Figure 37:
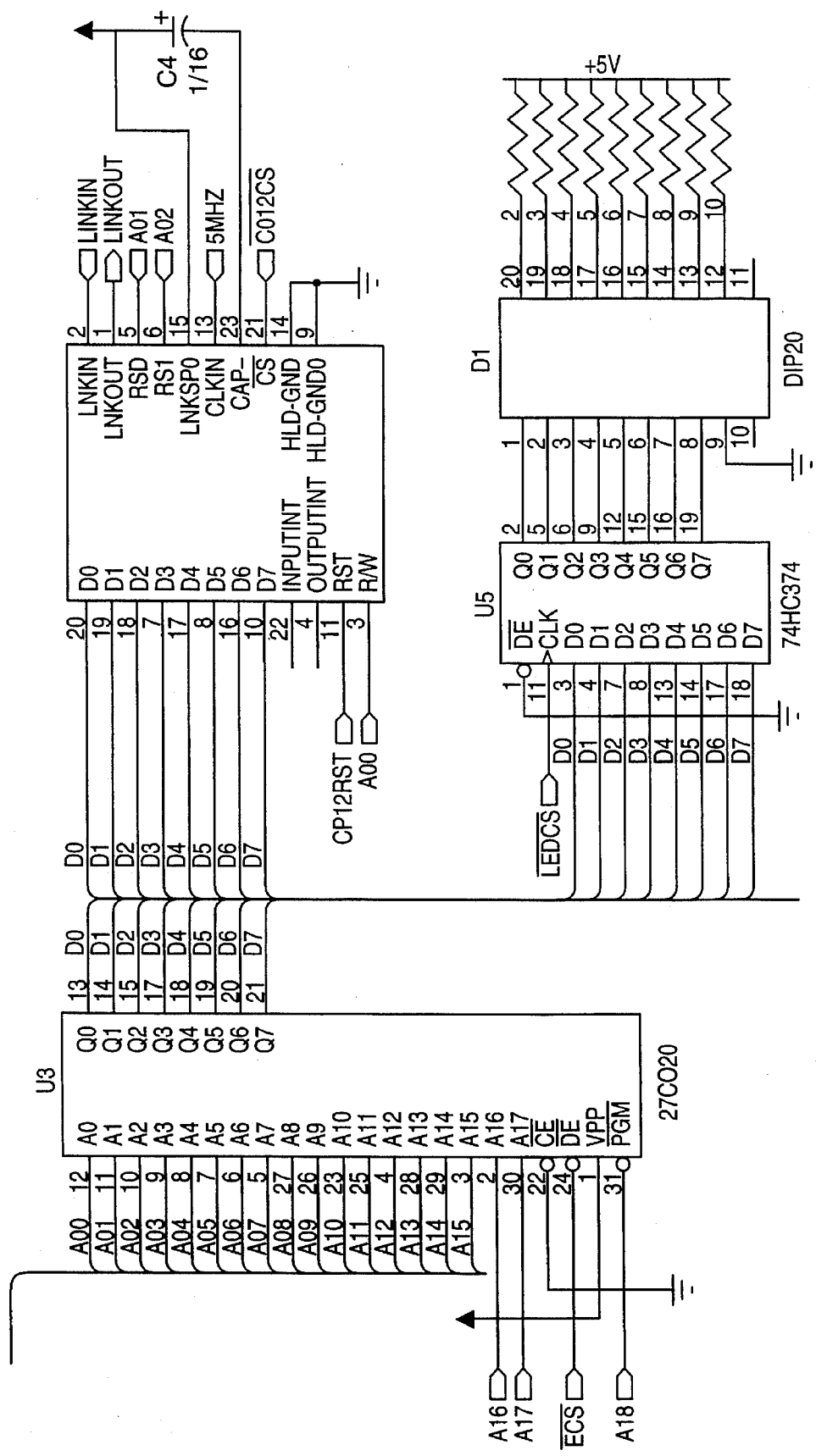
Figure 38:
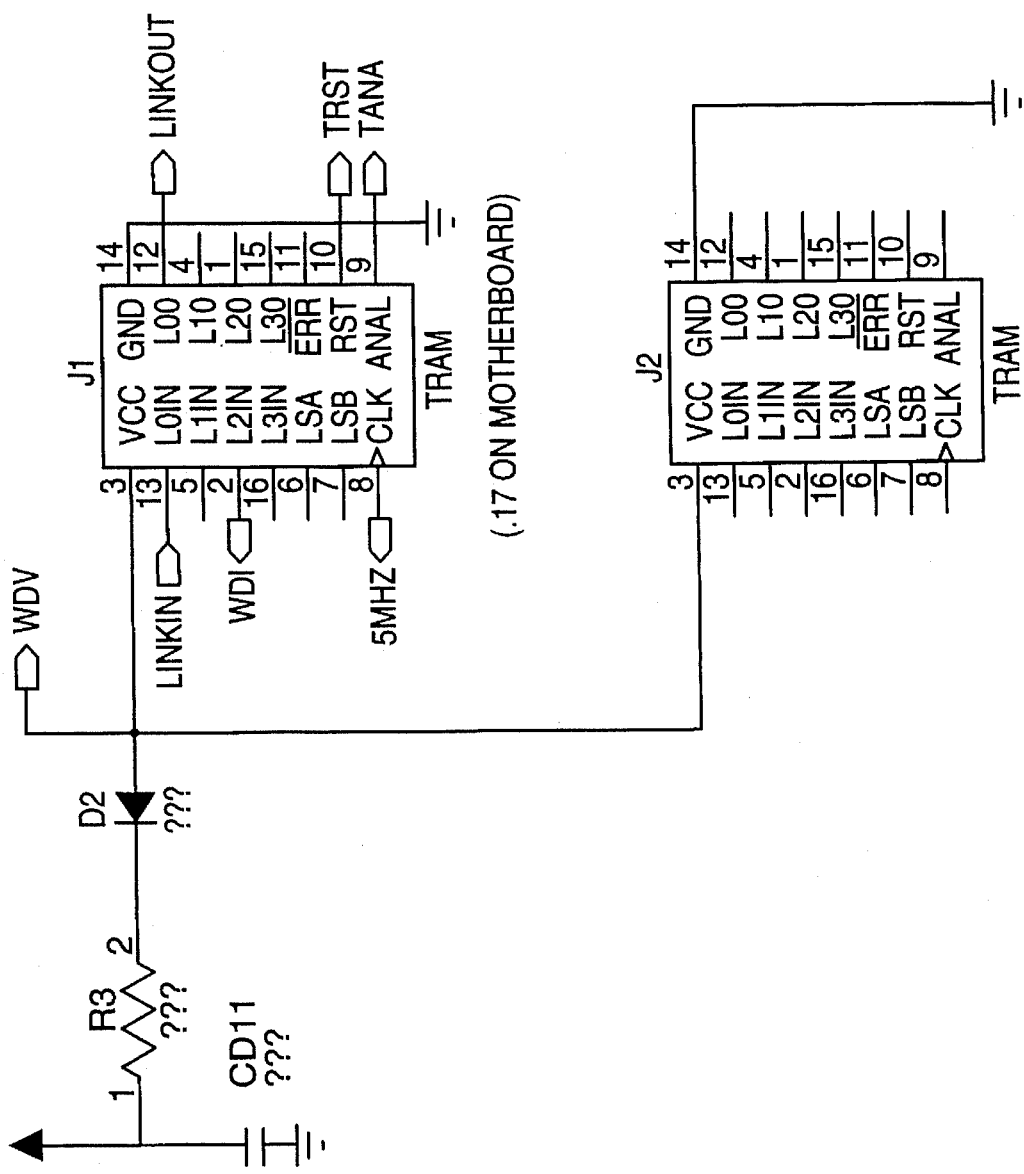
Figure 39:
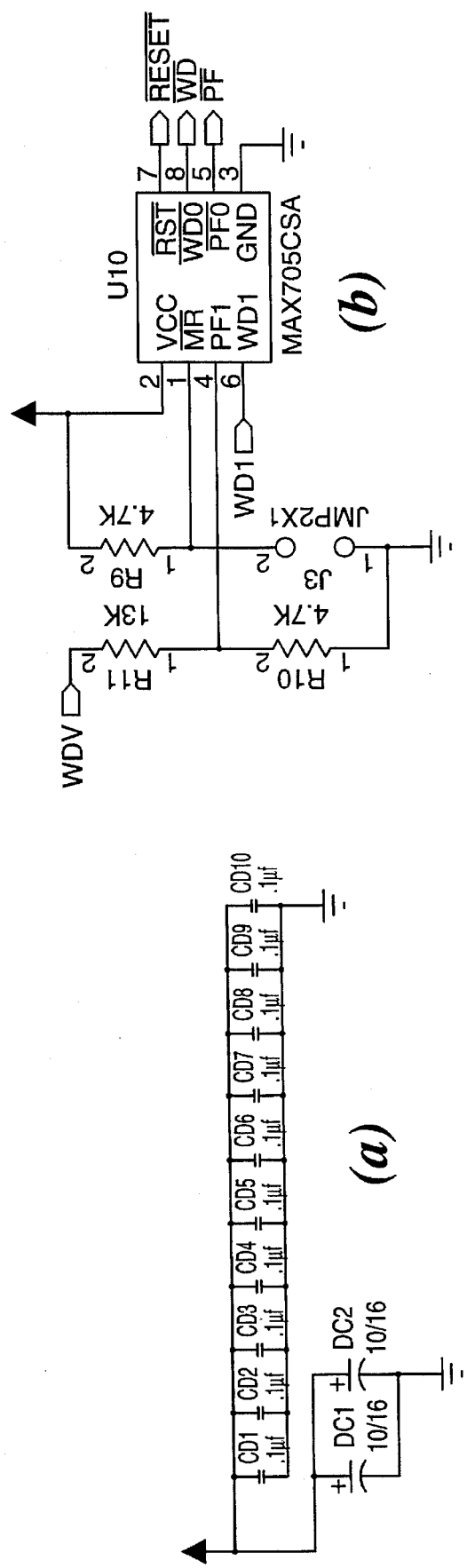

Next, T3 parses the two halves of the packet header and determines the length of the data portion of the waiting packet. This length is transmitted back to T4. T4 and T3 then concurrently read the data, with half of the data being read by a process on each parallel processor. As shown in FIG. 6, T3 and T4 are each equipped with a data transmit buffer to hold the data. T4 and T3 concurrently transmit their respective halves of the data to T2, where the data resides in the T2 data transmit buffer. The data transmit buffers are preferably implemented with static RAM (FIGS. 13, 16, and 21).

With reference now to FIGS. 1, 2, 3, and 6, the task of moving the data from T2 to the communication link 50 is presently accomplished as follows. If the packet is an acknowledgement generated outside the DTUs 30, 40, the packet may be thrown away if the DTUs are configured to generate their own acknowledgements as described herein. Otherwise, T2 generates a packet header which uniquely identifies the data, and writes ("dispatches") the header and data to the nonvolatile buffer 66. T2 also sends a copy of the data to the CSU 70, which prepares the data for transmission and places it on the communication link 50. The preparation preferably includes computing a checksum on the data so that CRC error checking or another conventional algorithm can be used to detect transmission errors and cause retransmission of the data to the remote DTU 40. The data may be compressed and/or encrypted using conventional algorithms and hardware before it is placed on the communication link 50.

The communication link 50 may be a telecommunications T1 (also known as "DS1"), T2 ("DS2"), T3 ("DS3"), E1, E2, or E3 link, a fractional T1 link, an Asynchronous Transfer Mode ("ATM") link, a Frame Relay link, a so-called "10 megabit per second bridged service" link having a bandwidth of approximately 10 Mbits/second, an analog telephone line connected to modems, an Ethernet, an ISDN link, a 56-switched link, or another conventional communication link. The link 50 may include physical connections in the form of cables, twisted pair wires, analog telephone lines, microwave transmitters and receivers, optical fibers, or other conventional signal carriers. The output end of the communication link 50 is preferably physically separated from its input end by a distance of at least 100 feet, and may be separated by thousands of feet or even by many miles.

The link interface 34 is preferably implemented at least in part with a communication-link-specific daughter board which snaps into a connector on an interface motherboard. The CSU 70 (FIG. 2) is preferably located on such a daughter board, with the parallel processors 60 being located on the motherboard. Thus, the hardware changes needed to tailor the link interface 34 to different communication links are easily effected in the field.

With reference now to FIGS. 1, 2, 4, and 7, the task of moving data from the communication link 50 to the remote disk 20 is accomplished by the remote DTU 40 as follows. T4 reads a data packet from the CSU 70. Recalling that the DTUs 30 and 40 preferably comprise identical hardware, note that the CSU 70 now referred to is part of the remote DTU 40, not part of the primary DTU 30.

T4 then examines the data packet. If the packet is an acknowledge generated by the DTUs, T4 sends the acknowledge to T2, and T2 clears the appropriate entry in a packet allocation table, thereby freeing space on the nonvolatile buffer 66. If the packet is a data packet, T4 sends half of the packet to T3. Then T4 and T3 concurrently write their respective halves of the data packet to the remote server 12.

With reference to FIGS. 1, 2, 5 and 7, the present invention optionally includes the task of sending a "spoof packet" as an acknowledgement to the primary server 10 indicating that the data has been received. The spoof packet is in the format of an acknowledgement that would be sent by a conventional hard disk drive controller when the operating system writes data to the hard disk. As described below, the user may specify which of several events should trigger generation of a spoof packet, and may enable or disable spoofing to balance server 10 performance against the risk of lost data.

In a presently preferred embodiment, the invention generates a spoof packet and sends the spoof packet to the operating system of the primary network server 10 in response to any of several user-selectable trigger events. For instance, users may choose to generate and send a spoof packet after the primary DTU 30 receives the mirrored data, after the data is stored in the nonvolatile buffer 66 of the primary DTU 30, after the data has been transferred to the communication link 50 by the primary DTU 30, after the data has been received from the communication link 50 by the remote DTU 40, or after the data is transferred to the remote server 12. The spoof packet may also be generated and sent a given time after one of these trigger events. Alternatively, the invention may be configured to generate no spoof packets but to instead simply pass along to the primary server 10 the acknowledgements generated by the nonvolatile store 20 of the remote server 12.

The spoof packet is preferably generated by the DTU involved in the triggering event. For instance, if the trigger is storage of the mirrored data in the nonvolatile buffer 66 of the primary DTU 30, T2 prepares a spoof packet acknowledging receipt of the data. Before sending a spoof packet, T2 first determines that the packet being transmitted is a data packet that needs to be spoofed. T2 then sends the spoof packet to T4. T4 divides the spoof packet in half and sends half to T3. Then T3 and T4 concurrently write their respective halves of the spoof packet to the primary server 10. Note that the spoof packet may be received by the primary server 10 before the data reaches the remote hard disk 20. The acknowledgement packet generated by the hard disk 20 or by its controller will be thrown away and thus will never reach the primary server 10, which receives the spoof packet instead.

In addition to specifying a triggering event, it is presently preferred that the user be permitted to specify a cache buffer threshold which determines whether or not spoofing is enabled. Data destined for eventual storage in a nonvolatile store is typically written first to a volatile cache buffer (not shown) in the primary network server 10. Cache buffers which hold data that has not yet been written to a nonvolatile store, i.e., data which is held pending a write, are conventionally termed "dirty cache buffers."

The total storage capacity of the primary server's cache buffers is limited. If the cache buffers fill up, performance of the primary server 10 may decrease perceptibly because the network operating system waits for an acknowledgement after each disk write before proceeding. Without spoofing, such acknowledgements may be long in coming because the "oldest" data, i.e. data written first to the cache buffers, has priority over other data for disk writes. Thus, if burst traffic occurs from the primary server 10 to the cache buffers associated with the server interface 32, and the magnitude of that burst traffic exceeds the bandwidth of the link 50, then the percentage of cache buffers which are dirty may increase to a point where overall server 10 disk access performance becomes very poor.

Enabling spoofing generally helps clean out the dirty cache buffers because the network operating system on the primary server 10 generally receives spoofing packets sooner than acknowledgements that are generated by the remote nonvolatile store 20. However, spoofing is preferably disabled when the percentage of cache buffers that are dirty falls below a user-specified threshold, e.g., 75 percent. Depending on the trigger event which causes generation of the spoof packet, the data being acknowledged has various degrees of vulnerability to loss in the event of a disaster. Some users may elect to disable spoofing permanently to avoid possible data loss. Dirty cache information is readily obtained by software, such as a NetWare Loadable Module or the equivalent, and relayed from the primary server 10 to the link interface 32 for use in enabling or disabling spoofing.

With reference to FIG. 1, the typical general operation of the present invention thus proceeds as follows. The network operating system on the primary server 10 copies critical data which is destined for the local hard disk 16. The operating system sends the mirrored data to a device it sees as simply another hard drive controller, but which is actually the server interface 32.

The server interface 32 transmits the mirrored data to the link interface 34, which stores the data on a local disk drive 68 (FIG. 2) and sends the primary server's operating system a spoof packet acknowledging receipt of the data. The link interface 34 then sends the mirrored data across the conventional communication link 50 to the remote DTU 40, which is located at a safe distance from the primary DTU 30. The remote DTU 40 sends the mirrored data in turn to the remote network server 12, where it is stored on a remote hard disk 20.

Although a configuration involving only two network servers 10, 12 is illustrated, those of skill in the art will appreciate that additional servers may also be employed according to the present invention. For instance, a primary and secondary server may be located in the same room while a tertiary server is located miles away. The primary server would then locally mirror data to the secondary server by conventional means, and would remotely mirror critical data to the tertiary server according to the present invention.

Thus, the present invention provides a system and method for effectively protecting mission-critical data in a computer network. Unlike data shadowing or tape backup approaches, the present invention stores mirrored data and hence maintains a substantially current copy of the data, including data which is being written to open files, without limiting access by other users. The mirrored data is moved by the DTUs to safe distances that may be many miles from the original data. The copied data is also useable immediately after a disaster, because it has been copied to the hard disk of a "warm" remote network server which can be rapidly installed as the new primary network server.

The invention may be embodied in other specific forms without departing from its spirit or essential characteristics. The described embodiments are to be considered in all respects only as illustrative and not restrictive. Any explanations provided herein of the scientific principles employed in the present invention are illustrative only. The scope of the invention is, therefore, indicated by the appended claims rather than by the foregoing description. All changes which come within the meaning and range of equivalency of the claims are to be embraced within their scope.

What is claimed and desired to be secured by patent is:

1. A system for remote mirroring of digital data from a primary network server to a remote network server, each network server having its own nonvolatile server store, said system comprising a primary data transfer unit and a remote data transfer unit, wherein:

said primary data transfer unit comprises:

a primary server interface which is digitally connectable to the primary network server, said primary server interface having sufficient bandwidth and signal compatibility to receive mirrored digital data from the primary network server, the mirrored data being a substantially concurrent copy of original data which is destined for storage in the nonvolatile server store of the primary network server; and a primary link interface digitally connected to said primary server interface and capable of receiving the mirrored data from said primary server interface, said primary link interface connectable to a communication link and capable of sending the mirrored data across the link to said remote data transfer unit, said primary link interface further comprising;

a nonvolatile data buffer for temporarily storing the mirrored data; and spoof packet generator capable of generating a pre-acknowledgement for transmission to the primary network server by said primary link interface after the mirrored data has been stored on said nonvolatile data buffer and before an acknowledgement arrives indicating that the mirrored data has been stored by the remote network server;

and said remote data transfer unit comprises:

a remote link interface connectable to the communication link for receiving the mirrored data sent across the link by said primary data transfer unit; and a remote server interface which is digitally connected to said remote link and capable of receiving the mirrored data from said remote link, said remote server interface being digitally connectable to the remote network server and having sufficient bandwidth and signal compatibility to send the mirrored data to the remote network server.

2. The system of claim 1, wherein said nonvolatile data buffer comprises a magnetic hard disk.

3. The system of claim 1, wherein said primary server interface receives from the primary network server a substantially concurrent copy of original data which is being written to an open file in the nonvolatile server store of the primary network server.

4. The system of claim 1, wherein said primary server interface receives from the primary network server a substantially concurrent copy of substantially all original data which is being stored in the nonvolatile server store of the primary network server.

5. The system of claim 1, wherein each of said data transfer units comprises a microprocessor and a block of volatile random access memory which is accessible by the microprocessor.

6. The system of claim 1, wherein each of said data transfer units comprises a plurality of digitally interconnected parallel processors, and each of said parallel processors comprises:

a processor;

a block of volatile random access memory which is accessible by the processor; and at least one interprocessor communication line which supports communication between at least two of said parallel processors.

7. The system of claim 6, wherein said interprocessor communication line is a serial communication line.

8. The system of claim 6, wherein each of said data transfer units comprises a plurality of said parallel processors which are capable of substantially concurrently processing different selected portions of the mirrored data.

9. The system of claim 1, wherein said primary data transfer unit and said remote data transfer unit comprise substantially identical hardware.

10. The system of claim 1, wherein said primary data transfer unit and said remote data transfer unit comprise substantially identical hardware and substantially identical software.

11. The system of claim 1, wherein said primary link interface is physically separated from said remote link interface by a distance of at least 100 feet.

12. The system of claim 1, wherein said primary link interface is physically separated from said remote link interface by a distance of at least 10,000 feet.

13. The system of claim 1, wherein said primary link interface is physically separated from said remote link interface by a distance of at least 30 miles.

14. The system of claim 1, wherein said system is configured such that the mirrored data is sent to the remote network server by the remote server interface within a delay time from the time the mirrored data is received by the primary server interface.

15. The system of claim 14, wherein said data transfer units are configured such that said delay time is less than one second.

16. The system of claim 14, wherein said data transfer units are configured such that said delay time is less than ten seconds.

17. The system of claim 1, wherein each of said link interfaces is connectable to a T1 communication link and said link interfaces are capable of transferring the mirrored data across the T1 communication link.

18. The system of claim 1, wherein each of said link interfaces is connectable to an E1 communication link and said link interfaces are capable of transferring the mirrored data across the E1 communication link.

19. The system of claim 1, wherein each of said link interfaces is connectable to an ISDN communication link and said link interfaces are capable of transferring the mirrored data across the ISDN communication link.

20. The system of claim 1, wherein each of said link interfaces is connectable to an analog telephone line communication link and said link interfaces are capable of transferring the mirrored data across the analog telephone line communication link.

21. The system of claim 1, wherein said primary link interface further comprises means for generating a checksum corresponding to given data, and said remote link interface further comprises corresponding means for using said checksum to detect transmission errors and for requesting retransmission of the given data by said primary link interface.

22. The system of claim 1, wherein said primary link interface further comprises a data compression means for compressing data prior to sending the data across the communication link, and said remote link interface further comprises a corresponding data decompression means for decompressing data that was compressed by said data compression means.

23. The system of claim 1, wherein said primary link interface further comprises a data encryption means for encrypting data prior to sending the data across the communication link, and said remote link interface further comprises a corresponding data decryption means for decrypting data that was encrypted by said data encryption means.

24. The system of claim 1, wherein each of said data transfer units further comprises a diagnostic unit which is digitally connected to said link interface and which is capable of providing selected status and diagnostic information about said link interface in a human-readable format.

25. A method for remote mirroring of digital data, said method comprising the steps of:
copying the data from a primary network server to a nonvolatile data buffer in a data transfer unit which is digitally connected to the primary network server, the primary network server including an operating system which is capable of accessing a nonvolatile server store, the data copied to the data transfer unit being a substantially concurrent copy of data which is being stored by the operating system in the nonvolatile server store of the primary network server;
copying the data from the data transfer unit to an input end of a communication link which has an output end physically separated from its input end;
generating and sending a spoof packet to the operating system of the primary network server; and
copying the data from the output end of the communication link to a nonvolatile server store on a remote network server.

26. The method of claim 25, wherein said step of generating and sending a spoof packet precedes said step of copying the data from the output end of the communication link.

27. The method of claim 23, wherein said step of generating and sending a spoof packet occurs in response to a triggering event selected by a user from the group consisting of:
receipt of the data by the data transfer unit which is digitally connected to the primary network server;
storage of the data in a nonvolatile buffer in the data transfer unit which is digitally connected to the primary network server;
copying of the data from the data transfer unit to the input end of the communication link;
copying of the data from the output end of the communication link to a second data transfer unit which is digitally connected to the remote network server; and
copying of the data to the remote network server.

28. The method of claim 25, wherein said step of copying the data from a primary network server to a data transfer unit comprises substantially concurrent copying of different selected portions of the data, said substantially concurrent copying being performed by a plurality of computer-implemented parallel copying processes which communicate with one another to coordinate said substantially concurrent copying.

29. The method of claim 25, wherein data which is being stored by the operating system in the nonvolatile server store of the primary network server travels along an internal communication path having a predetermined internal bandwidth, and said step of copying the data from the data transfer unit to the input end of the communication link comprises:
buffering at least some of the data within the data transfer unit; and
copying the data to a communication link which has a lower bandwidth than the internal bandwidth of the primary network server.

30. The method of claim 25, wherein said step of copying the data from a primary network server to a data transfer unit comprises the steps of:
copying a data packet header from the primary network server to the data transfer unit, the header including an indication of the length of the packet; and
copying additional data from the primary network server to the data transfer unit based on the indication of the length of the packet.

31. The method of claim 30, wherein said step of copying a data packet header comprises substantially concurrent copying of different selected portions of the data packet header, said substantially concurrent copying being performed by a plurality of computer-implemented parallel copying processes which communicate with one another to coordinate said substantially concurrent copying.

32. The method of claim 31, wherein said step of copying additional data comprises substantially concurrent copying of different selected portions of additional data, said substantially concurrent copying being performed by a plurality of computer-implemented parallel copying processes which communicate with one another to coordinate said substantially concurrent copying.

33. The method of claim 25, further comprising the steps of:
compressing the data prior to said step of copying the data from the data transfer unit to the input end of the communication link; and
decompressing the data after said step of copying the data from the output end of the communication link.

34. The method of claim 25, further comprising the steps of:
encrypting the data prior to said step of copying the data from the data transfer unit to the input end of the communication link; and
decrypting the data after said step of copying the data from the output end of the communication link.

* * * * *

UNITED STATES PATENT AND TRADEMARK OFFICE
CERTIFICATE OF CORRECTION

| | | |
|---|---|---|
| PATENT NO. | : 5,537,533 | Page 1 of 1 |
| APPLICATION NO. | : 08/289902 | |
| DATED | : July 16, 1996 | |
| INVENTOR(S) | : Vaughn Staheli et al. | |

It is certified that error appears in the above-identified patent and that said Letters Patent is hereby corrected as shown below:

On the Title page, item [21], delete "289,902" and insert --08/289,102--.

Signed and Sealed this
Twenty-fifth Day of October, 2011

David J. Kappos
*Director of the United States Patent and Trademark Office*